United States Patent
Compton et al.

(10) Patent No.: US 11,909,101 B2
(45) Date of Patent: Feb. 20, 2024

(54) ELECTRONIC DEVICES WITH BENT DIELECTRIC RESONATOR ANTENNAS

(71) Applicant: Apple Inc., Cupertino, CA (US)

(72) Inventors: Lucas R. Compton, San Francisco, CA (US); Harish Rajagopalan, San Jose, CA (US); James T. Handy, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/670,020

(22) Filed: Feb. 11, 2022

(65) Prior Publication Data

US 2023/0261363 A1    Aug. 17, 2023

(51) Int. Cl.
  *H01Q 1/24*       (2006.01)
  *H01Q 15/14*      (2006.01)
  *H05K 5/00*       (2006.01)

(52) U.S. Cl.
  CPC ............. *H01Q 1/243* (2013.01); *H01Q 15/14* (2013.01); *H05K 5/0017* (2013.01)

(58) Field of Classification Search
  CPC ...... H01Q 9/0485; H01Q 15/14; H01Q 1/243; H05K 5/0017
  See application file for complete search history.

(56) References Cited

U.S. PATENT DOCUMENTS

| | | | |
|---|---|---|---|
| 10,418,687 B2 | 9/2019 | Mow et al. | |
| 10,608,344 B2 | 3/2020 | Paulotto et al. | |
| 10,651,570 B2 | 5/2020 | Ukyanov et al. | |
| 10,742,250 B1 | 8/2020 | Hiemstra et al. | |
| 10,886,617 B2 | 1/2021 | Avser et al. | |
| 10,886,619 B2 | 1/2021 | Avser et al. | |
| 11,011,827 B2 | 5/2021 | Thai et al. | |
| 11,159,659 B2 | 10/2021 | Khripkov | |
| 11,205,850 B2 | 12/2021 | Jia | |
| 2013/0207851 A1 | 8/2013 | Dabov | |

(Continued)

OTHER PUBLICATIONS

M. Boyuan et al., Conformal Bent Dielectric Resonator Antennas With Curving Ground Plane, IEEE Transactions on Antennas and Propagation, Mar. 2019, pp. 1931-1936, vol. 67, No. 3, IEEE, New York, NY, United States.

(Continued)

*Primary Examiner* — Graham P Smith
(74) *Attorney, Agent, or Firm* — Treyz Law Group, P.C.; Michael H. Lyons

(57) ABSTRACT

An electronic device may be provided with a phased antenna array having a bent dielectric resonating element. The bent dielectric resonating element may have a first segment, a second segment nonparallel to the first segment, and an angled surface that couples the first segment to the second segment. One or more feed probes may be coupled to the first segment to excite the dielectric resonating element. A reflector may be provided on the angled surface to direct electromagnetic energy from the first segment to the second segment and vice versa. The bent dielectric resonating element may exhibit less overall height than dielectric resonators having straight columns of dielectric material, thereby allowing for a reduction in the thickness of the electronic device. The angled surface and the reflector may optimize the radio-frequency performance of the antenna despite the reduction in overall height.

19 Claims, 9 Drawing Sheets

(56) References Cited

U.S. PATENT DOCUMENTS

2014/0132466 A1    5/2014   Inoue et al.
2019/0020105 A1*   1/2019   Pance ..................... H01Q 1/38
2021/0075093 A1    3/2021   Zhang et al.
2021/0328351 A1   10/2021   Avser et al.

OTHER PUBLICATIONS

U.S. Appl. No. 17/029,599, filed Sep. 23, 2020.
U.S. Appl. No. 17/028,871, filed Sep. 22, 2020.
U.S. Appl. No. 17/235,240, filed Apr. 20, 2021.

* cited by examiner

ELECTRONIC DEVICES WITH BENT DIELECTRIC RESONATOR ANTENNAS

BACKGROUND

This relates generally to electronic devices and, more particularly, to electronic devices with wireless communications circuitry.

Electronic devices often include wireless communications circuitry. For example, cellular telephones, computers, and other devices often contain antennas and wireless transceivers for supporting wireless communications.

It may be desirable to support wireless communications in millimeter wave and centimeter wave communications bands. Millimeter wave communications, which are sometimes referred to as extremely high frequency (EHF) communications, and centimeter wave communications involve communications at frequencies of about 10-300 GHz. Operation at these frequencies can support high throughputs but may raise significant challenges. For example, radio-frequency signals at millimeter and centimeter wave frequencies can be characterized by substantial attenuation and/or distortion during signal propagation through various mediums. In addition, if care is not taken, the antennas can exhibit insufficient bandwidth and the presence of conductive electronic device components can make it difficult to incorporate components for handling millimeter and centimeter wave communications into the electronic device.

SUMMARY

An electronic device may be provided with wireless circuitry and a housing. The housing may have peripheral conductive housing structures and a rear wall. A display may be mounted to the peripheral conductive housing structures opposite the rear wall. A phased antenna array may radiate at a frequency greater than 10 GHz through a display cover layer, an antenna window in the housing, a sapphire cover layer used for a camera window in the device, a dielectric cover layer on a rear housing wall for the device, or other dielectric cover layers.

The phased antenna array may include a dielectric resonator antenna having a bent dielectric resonating element. The bent dielectric resonating element may have a first segment that extends along a first longitudinal axis, a second segment that extends from the first segment along a second longitudinal axis, and an angled surface that couples the first segment to the second segment. The angled surface may extend nonparallel to the first and second longitudinal axes. One or more feed probes may be coupled to the first segment to excite the dielectric resonating element. A reflector may be provided on the angled surface to direct electromagnetic energy from the first segment to the second segment and vice versa. The bent dielectric resonating element may exhibit less overall height than dielectric resonators having straight columns of dielectric material, thereby allowing for a reduction in the thickness of the electronic device. The angled surface and the reflector may optimize the radio-frequency performance of the antenna despite the reduction in overall height.

DETAILED DESCRIPTION

Figure 1:
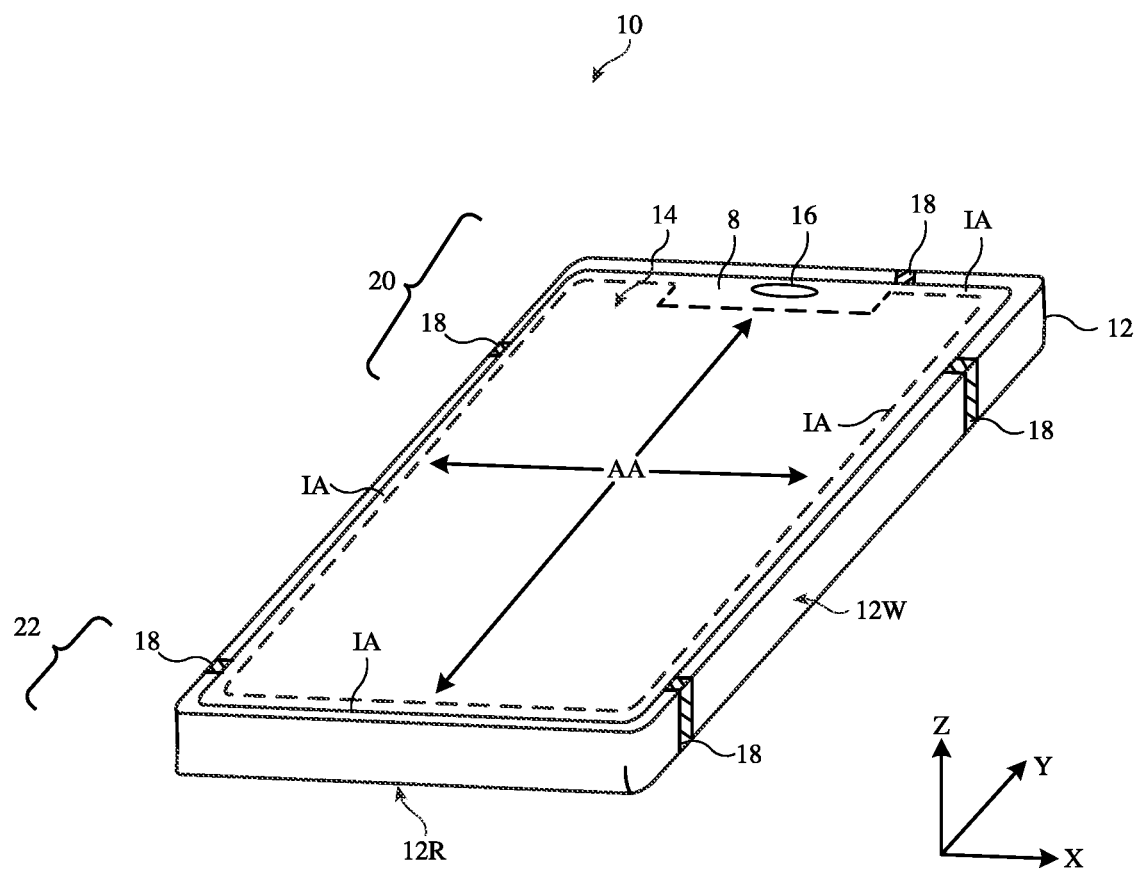
FIG. 1 is a perspective view of an illustrative electronic device in accordance with some embodiments.

An electronic device such as electronic device 10 of FIG. 1 may be provided with wireless circuitry that includes antennas. The antennas may be used to transmit and/or receive wireless radio-frequency signals. The antennas may include phased antenna arrays that are used for performing wireless communications and/or spatial ranging operations using millimeter and centimeter wave signals. Millimeter wave signals, which are sometimes referred to as extremely high frequency (EHF) signals, propagate at frequencies above about 30 GHz (e.g., at 60 GHz or other frequencies between about 30 GHz and 300 GHz). Centimeter wave signals propagate at frequencies between about 10 GHz and 30 GHz. If desired, device 10 may also contain antennas for handling satellite navigation system signals, cellular telephone signals, local wireless area network signals, near-field communications, light-based wireless communications, or other wireless communications.

Device 10 may be a portable electronic device or other suitable electronic device. For example, device 10 may be a laptop computer, a tablet computer, a somewhat smaller device such as a wrist-watch device, pendant device, headphone device, earpiece device, headset device, or other wearable or miniature device, a handheld device such as a cellular telephone, a media player, or other small portable device. Device 10 may also be a set-top box, a desktop computer, a display into which a computer or other processing circuitry has been integrated, a display without an integrated computer, a wireless access point, a wireless base station, an electronic device incorporated into a kiosk, building, or vehicle, or other suitable electronic equipment.

Device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may, if desired, have a display such as display 14. Display 14 may be mounted on the front face of device 10. Display 14 may be a touch screen that incorporates capacitive touch electrodes or may be insensitive to touch. The rear face of housing 12 (i.e., the face of device 10 opposing the front face of device 10) may have a substantially planar housing wall such as rear housing wall 12R (e.g., a planar housing wall). Rear housing wall 12R may have slots that pass entirely through the rear housing wall and that therefore separate portions of housing 12 from each other. Rear housing wall 12R may include conductive portions and/or dielectric portions. If desired, rear housing wall 12R may include a planar metal layer covered by a thin layer or coating of dielectric such as glass, plastic, sapphire, or ceramic (e.g., a dielectric cover layer). Housing 12 may also have shallow grooves that do not pass entirely through housing 12. The slots and grooves may be filled with plastic or other dielectric materials. If desired, portions of housing 12 that have been separated from each other (e.g., by a through slot) may be joined by internal conductive structures (e.g., sheet metal or other metal members that bridge the slot).

Housing 12 may include peripheral housing structures such as peripheral structures 12W. Conductive portions of peripheral structures 12W and conductive portions of rear housing wall 12R may sometimes be referred to herein collectively as conductive structures of housing 12. Peripheral structures 12W may run around the periphery of device 10 and display 14. In configurations in which device 10 and display 14 have a rectangular shape with four edges, peripheral structures 12W may be implemented using peripheral housing structures that have a rectangular ring shape with four corresponding edges and that extend from rear housing wall 12R to the front face of device 10 (as an example). In other words, device 10 may have a length (e.g., measured parallel to the Y-axis), a width that is less than the length (e.g., measured parallel to the X-axis), and a height (e.g., measured parallel to the Z-axis) that is less than the width. Peripheral structures 12W or part of peripheral structures 12W may serve as a bezel for display 14 (e.g., a cosmetic trim that surrounds all four sides of display 14 and/or that helps hold display 14 to device 10) if desired. Peripheral structures 12W may, if desired, form sidewall structures for device 10 (e.g., by forming a metal band with vertical sidewalls, curved sidewalls, etc.).

Peripheral structures 12W may be formed of a conductive material such as metal and may therefore sometimes be referred to as peripheral conductive housing structures, conductive housing structures, peripheral metal structures, peripheral conductive sidewalls, peripheral conductive sidewall structures, conductive housing sidewalls, peripheral conductive housing sidewalls, sidewalls, sidewall structures, or a peripheral conductive housing member (as examples). Peripheral conductive housing structures 12W may be formed from a metal such as stainless steel, aluminum, alloys, or other suitable materials. One, two, or more than two separate structures may be used in forming peripheral conductive housing structures 12W.

It is not necessary for peripheral conductive housing structures 12W to have a uniform cross-section. For example, the top portion of peripheral conductive housing structures 12W may, if desired, have an inwardly protruding ledge that helps hold display 14 in place. The bottom portion of peripheral conductive housing structures 12W may also have an enlarged lip (e.g., in the plane of the rear surface of device 10). Peripheral conductive housing structures 12W may have substantially straight vertical sidewalls, may have sidewalls that are curved, or may have other suitable shapes. In some configurations (e.g., when peripheral conductive housing structures 12W serve as a bezel for display 14), peripheral conductive housing structures 12W may run around the lip of housing 12 (i.e., peripheral conductive housing structures 12W may cover only the edge of housing 12 that surrounds display 14 and not the rest of the sidewalls of housing 12).

Rear housing wall 12R may lie in a plane that is parallel to display 14. In configurations for device 10 in which some or all of rear housing wall 12R is formed from metal, it may be desirable to form parts of peripheral conductive housing structures 12W as integral portions of the housing structures forming rear housing wall 12R. For example, rear housing wall 12R of device 10 may include a planar metal structure and portions of peripheral conductive housing structures 12W on the sides of housing 12 may be formed as flat or curved vertically extending integral metal portions of the planar metal structure (e.g., housing structures 12R and 12W may be formed from a continuous piece of metal in a unibody configuration). Housing structures such as these may, if desired, be machined from a block of metal and/or may include multiple metal pieces that are assembled together to form housing 12. Rear housing wall 12R may have one or more, two or more, or three or more portions. Peripheral conductive housing structures 12W and/or conductive portions of rear housing wall 12R may form one or more exterior surfaces of device 10 (e.g., surfaces that are visible to a user of device 10) and/or may be implemented using internal structures that do not form exterior surfaces of device 10 (e.g., conductive housing structures that are not visible to a user of device 10 such as conductive structures that are covered with layers such as thin cosmetic layers, protective coatings, and/or other coating/cover layers that may include dielectric materials such as glass, ceramic, plastic, or other structures that form the exterior surfaces of device 10 and/or serve to hide peripheral conductive housing structures 12W and/or conductive portions of rear housing wall 12R from view of the user).

Display 14 may have an array of pixels that form an active area AA that displays images for a user of device 10. For example, active area AA may include an array of display pixels. The array of pixels may be formed from liquid crystal display (LCD) components, an array of electrophoretic pixels, an array of plasma display pixels, an array of organic light-emitting diode display pixels or other light-emitting diode pixels, an array of electrowetting display pixels, or display pixels based on other display technologies. If desired, active area AA may include touch sensors such as touch sensor capacitive electrodes, force sensors, or other sensors for gathering a user input.

Display 14 may have an inactive border region that runs along one or more of the edges of active area AA. Inactive area IA of display 14 may be free of pixels for displaying images and may overlap circuitry and other internal device structures in housing 12. To block these structures from view by a user of device 10, the underside of the display cover layer or other layers in display 14 that overlap inactive area IA may be coated with an opaque masking layer in inactive area IA. The opaque masking layer may have any suitable color. Inactive area IA may include a recessed region or notch that extends into active area AA (e.g., at speaker port 16). Active area AA may, for example, be defined by the lateral area of a display module for display 14 (e.g., a display module that includes pixel circuitry, touch sensor circuitry, etc.).

Display 14 may be protected using a display cover layer such as a layer of transparent glass, clear plastic, transparent ceramic, sapphire, or other transparent crystalline material, or other transparent layer(s). The display cover layer may have a planar shape, a convex curved profile, a shape with planar and curved portions, a layout that includes a planar main area surrounded on one or more edges with a portion that is bent out of the plane of the planar main area, or other suitable shapes. The display cover layer may cover the entire front face of device 10. In another suitable arrangement, the display cover layer may cover substantially all of the front face of device 10 or only a portion of the front face of device 10. Openings may be formed in the display cover layer. For example, an opening may be formed in the display cover layer to accommodate a button. An opening may also be formed in the display cover layer to accommodate ports such as speaker port 16 or a microphone port. Openings may be formed in housing 12 to form communications ports (e.g., an audio jack port, a digital data port, etc.) and/or audio ports for audio components such as a speaker and/or a microphone if desired.

Display 14 may include conductive structures such as an array of capacitive electrodes for a touch sensor, conductive lines for addressing pixels, driver circuits, etc. Housing 12 may include internal conductive structures such as metal frame members and a planar conductive housing member (sometimes referred to as a conductive support plate or backplate) that spans the walls of housing 12 (e.g., a substantially rectangular sheet formed from one or more metal parts that is welded or otherwise connected between opposing sides of peripheral conductive housing structures 12W). The conductive support plate may form an exterior rear surface of device 10 or may be covered by a dielectric cover layer such as a thin cosmetic layer, protective coating, and/or other coatings that may include dielectric materials such as glass, ceramic, plastic, or other structures that form the exterior surfaces of device 10 and/or serve to hide the conductive support plate from view of the user (e.g., the conductive support plate may form part of rear housing wall 12R). Device 10 may also include conductive structures such as printed circuit boards, components mounted on printed circuit boards, and other internal conductive structures. These conductive structures, which may be used in forming a ground plane in device 10, may extend under active area AA of display 14, for example.

In regions 22 and 20, openings may be formed within the conductive structures of device 10 (e.g., between peripheral conductive housing structures 12W and opposing conductive ground structures such as conductive portions of rear housing wall 12R, conductive traces on a printed circuit board, conductive electrical components in display 14, etc.). These openings, which may sometimes be referred to as gaps, may be filled with air, plastic, and/or other dielectrics and may be used in forming slot antenna resonating elements for one or more antennas in device 10, if desired.

Conductive housing structures and other conductive structures in device 10 may serve as a ground plane for the antennas in device 10. The openings in regions 22 and 20 may serve as slots in open or closed slot antennas, may serve as a central dielectric region that is surrounded by a conductive path of materials in a loop antenna, may serve as a space that separates an antenna resonating element such as a strip antenna resonating element or an inverted-F antenna resonating element from the ground plane, may contribute to the performance of a parasitic antenna resonating element, or may otherwise serve as part of antenna structures formed in regions 22 and 20. If desired, the ground plane that is under active area AA of display 14 and/or other metal structures in device 10 may have portions that extend into parts of the ends of device 10 (e.g., the ground may extend towards the dielectric-filled openings in regions 22 and 20), thereby narrowing the slots in regions 22 and 20. Region 22 may sometimes be referred to herein as lower region 22 or lower end 22 of device 10. Region 20 may sometimes be referred to herein as upper region 20 or upper end 20 of device 10.

In general, device 10 may include any suitable number of antennas (e.g., one or more, two or more, three or more, four or more, etc.). The antennas in device 10 may be located at opposing first and second ends of an elongated device housing (e.g., at lower region 22 and/or upper region 20 of device 10 of FIG. 1), along one or more edges of a device housing, in the center of a device housing, in other suitable locations, or in one or more of these locations. The arrangement of FIG. 1 is merely illustrative.

Portions of peripheral conductive housing structures 12W may be provided with peripheral gap structures. For example, peripheral conductive housing structures 12W may be provided with one or more dielectric-filled gaps such as gaps 18, as shown in FIG. 1. The gaps in peripheral conductive housing structures 12W may be filled with dielectric such as polymer, ceramic, glass, air, other dielectric materials, or combinations of these materials. Gaps 18 may divide peripheral conductive housing structures 12W into one or more peripheral conductive segments. The conductive segments that are formed in this way may form parts of antennas in device 10 if desired. Other dielectric openings may be formed in peripheral conductive housing structures 12W (e.g., dielectric openings other than gaps 18) and may serve as dielectric antenna windows for antennas mounted within the interior of device 10. Antennas within device 10 may be aligned with the dielectric antenna windows for conveying radio-frequency signals through peripheral conductive housing structures 12W. Antennas within device 10 may also be aligned with inactive area IA of display 14 for conveying radio-frequency signals through display 14.

To provide an end user of device 10 with as large of a display as possible (e.g., to maximize an area of the device used for displaying media, running applications, etc.), it may be desirable to increase the amount of area at the front face of device 10 that is covered by active area AA of display 14. Increasing the size of active area AA may reduce the size of inactive area IA within device 10. This may reduce the area behind display 14 that is available for antennas within device 10. For example, active area AA of display 14 may include conductive structures that serve to block radio-frequency signals handled by antennas mounted behind active area AA from radiating through the front face of device 10. It would therefore be desirable to be able to provide antennas that occupy a small amount of space within device 10 (e.g., to allow for as large of a display active area AA as possible) while still allowing the antennas to communicate with wireless equipment external to device 10 with satisfactory efficiency bandwidth.

In a typical scenario, device 10 may have one or more upper antennas and one or more lower antennas. An upper antenna may, for example, be formed in upper region 20 of device 10. A lower antenna may, for example, be formed in lower region 22 of device 10. Additional antennas may be formed along the edges of housing 12 extending between regions 20 and 22 if desired. An example in which device 10 includes three or four upper antennas and five lower antennas is described herein as an example. The antennas may be used separately to cover identical communications bands, overlapping communications bands, or separate communications bands. The antennas may be used to implement an antenna diversity scheme or a multiple-input-multiple-output (MIMO) antenna scheme. Other antennas for covering any other desired frequencies may also be mounted at any desired locations within the interior of device 10. The example of FIG. 1 is merely illustrative. If desired, housing 12 may have other shapes (e.g., a square shape, cylindrical shape, spherical shape, combinations of these and/or different shapes, etc.).

Figure 2:
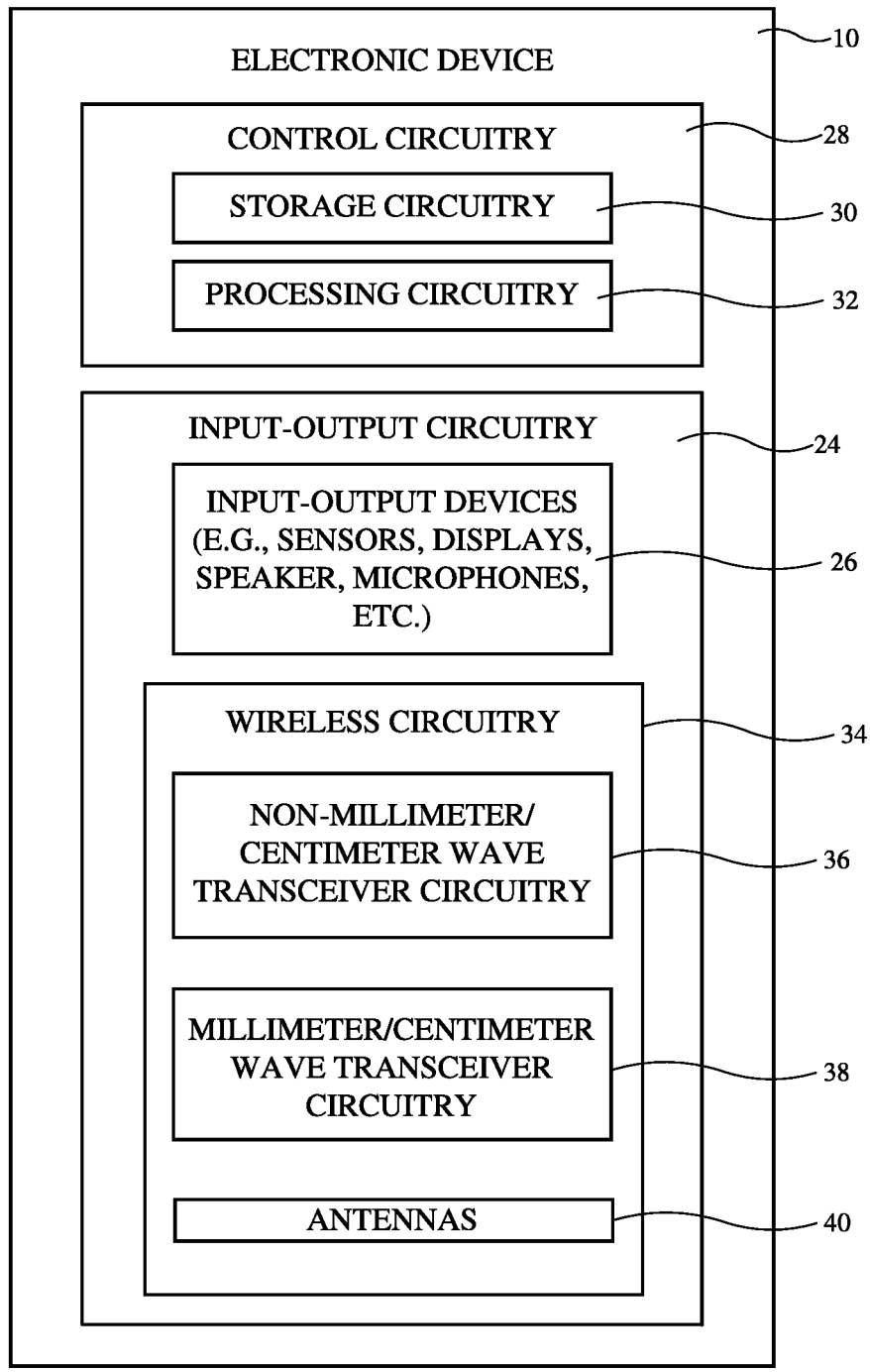
FIG. 2 is a schematic diagram of illustrative circuitry in an electronic device in accordance with some embodiments.

A schematic diagram of illustrative components that may be used in device 10 is shown in FIG. 2. As shown in FIG. 2, device 10 may include control circuitry 28. Control circuitry 28 may include storage such as storage circuitry 30. Storage circuitry 30 may include hard disk drive storage, nonvolatile memory (e.g., flash memory or other electrically-programmable-read-only memory configured to form a solid-state drive), volatile memory (e.g., static or dynamic random-access-memory), etc.

Control circuitry 28 may include processing circuitry such as processing circuitry 32. Processing circuitry 32 may be used to control the operation of device 10. Processing circuitry 32 may include on one or more microprocessors, microcontrollers, digital signal processors, host processors, baseband processor integrated circuits, application specific integrated circuits, central processing units (CPUs), graphics processing units (GPUs), etc. Control circuitry 28 may be configured to perform operations in device 10 using hardware (e.g., dedicated hardware or circuitry), firmware, and/or software. Software code for performing operations in device 10 may be stored on storage circuitry 30 (e.g., storage circuitry 30 may include non-transitory (tangible) computer readable storage media that stores the software code). The software code may sometimes be referred to as program instructions, software, data, instructions, or code. Software code stored on storage circuitry 30 may be executed by processing circuitry 32.

Control circuitry 28 may be used to run software on device 10 such as internet browsing applications, voice-over-internet-protocol (VOIP) telephone call applications, email applications, media playback applications, operating system functions, etc. To support interactions with external equipment, control circuitry 28 may be used in implementing communications protocols. Communications protocols that may be implemented using control circuitry 28 include internet protocols, wireless local area network protocols (e.g., IEEE 802.11 protocols—sometimes referred to as WiFi®), protocols for other short-range wireless communications links such as the Bluetooth® protocol or other WPAN protocols, IEEE 802.11ad protocols, cellular telephone protocols, MIMO protocols, antenna diversity protocols, satellite navigation system protocols, antenna-based spatial ranging protocols (e.g., radio detection and ranging (RADAR) protocols or other desired range detection protocols for signals conveyed at millimeter and centimeter wave frequencies), etc. Each communication protocol may be associated with a corresponding radio access technology (RAT) that specifies the physical connection methodology used in implementing the protocol.

Device 10 may include input-output circuitry 24. Input-output circuitry 24 may include input-output devices 26. Input-output devices 26 may be used to allow data to be supplied to device 10 and to allow data to be provided from device 10 to external devices. Input-output devices 26 may include user interface devices, data port devices, sensors, and other input-output components. For example, input-output devices may include touch screens, displays without touch sensor capabilities, buttons, joysticks, scrolling wheels, touch pads, key pads, keyboards, microphones, cameras, speakers, status indicators, light sources, audio jacks and other audio port components, digital data port devices, light sensors, gyroscopes, accelerometers or other components that can detect motion and device orientation relative to the Earth, capacitance sensors, proximity sensors (e.g., a capacitive proximity sensor and/or an infrared proximity sensor), magnetic sensors, and other sensors and input-output components.

Input-output circuitry 24 may include wireless circuitry such as wireless circuitry 34 for wirelessly conveying radio-frequency signals. While control circuitry 28 is shown separately from wireless circuitry 34 in the example of FIG. 2 for the sake of clarity, wireless circuitry 34 may include processing circuitry that forms a part of processing circuitry 32 and/or storage circuitry that forms a part of storage circuitry 30 of control circuitry 28 (e.g., portions of control circuitry 28 may be implemented on wireless circuitry 34). As an example, control circuitry 28 may include baseband processor circuitry or other control components that form a part of wireless circuitry 34.

Wireless circuitry 34 may include millimeter and centimeter wave transceiver circuitry such as millimeter/centimeter wave transceiver circuitry 38. Millimeter/centimeter wave transceiver circuitry 38 may support communications at frequencies between about 10 GHz and 300 GHz. For example, millimeter/centimeter wave transceiver circuitry 38 may support communications in Extremely High Frequency (EHF) or millimeter wave communications bands between about 30 GHz and 300 GHz and/or in centimeter wave communications bands between about 10 GHz and 30 GHz (sometimes referred to as Super High Frequency (SHF) bands). As examples, millimeter/centimeter wave transceiver circuitry 38 may support communications in an IEEE K communications band between about 18 GHz and 27 GHz, a $K_a$ communications band between about 26.5 GHz and 40 GHz, a $K_u$ communications band between about 12 GHz and 18 GHz, a V communications band between about 40 GHz and 75 GHz, a W communications band between about 75 GHz and 110 GHz, or any other desired frequency band between approximately 10 GHz and 300 GHz. If desired, millimeter/centimeter wave transceiver circuitry 38 may support IEEE 802.11ad communications at 60 GHz (e.g., WiGig or 60 GHz Wi-Fi bands around 57-61 GHz), and/or $5^{th}$ generation mobile networks or $5^{th}$ generation wireless systems (5G) New Radio (NR) Frequency Range 2 (FR2) communications bands between about 24 GHz and 90 GHz. Millimeter/centimeter wave transceiver circuitry 38 may be formed from one or more integrated circuits (e.g., multiple integrated circuits mounted on a common printed circuit in a system-in-package device, one or more integrated circuits mounted on different substrates, etc.).

Millimeter/centimeter wave transceiver circuitry 38 (sometimes referred to herein simply as transceiver circuitry 38 or millimeter/centimeter wave circuitry 38) may perform spatial ranging operations using radio-frequency signals at millimeter and/or centimeter wave frequencies that are transmitted and received by millimeter/centimeter wave transceiver circuitry 38. The received signals may be a version of the transmitted signals that have been reflected off of external objects and back towards device 10. Control circuitry 28 may process the transmitted and received signals to detect or estimate a range between device 10 and one or more external objects in the surroundings of device 10 (e.g., objects external to device 10 such as the body of a user or other persons, other devices, animals, furniture, walls, or other objects or obstacles in the vicinity of device 10). If desired, control circuitry 28 may also process the transmitted and received signals to identify a two or three-dimensional spatial location of the external objects relative to device 10.

Spatial ranging operations performed by millimeter/centimeter wave transceiver circuitry 38 are unidirectional. If desired, millimeter/centimeter wave transceiver circuitry 38 may also perform bidirectional communications with external wireless equipment such as external wireless equipment 10 (e.g., over a bi-directional millimeter/centimeter wave wireless communications link). The external wireless equipment may include other electronic devices such as electronic device 10, a wireless base station, wireless access point, a wireless accessory, or any other desired equipment that transmits and receives millimeter/centimeter wave signals. Bidirectional communications involve both the transmission of wireless data by millimeter/centimeter wave transceiver circuitry 38 and the reception of wireless data that has been transmitted by external wireless equipment. The wireless data may, for example, include data that has been encoded into corresponding data packets such as wireless data associated with a telephone call, streaming media content, internet browsing, wireless data associated with software applications running on device 10, email messages, etc.

If desired, wireless circuitry 34 may include transceiver circuitry for handling communications at frequencies below 10 GHz such as non-millimeter/centimeter wave transceiver circuitry 36. For example, non-millimeter/centimeter wave transceiver circuitry 36 may handle wireless local area network (WLAN) communications bands such as the 2.4 GHz and 5 GHz Wi-Fi® (IEEE 802.11) bands, wireless personal area network (WPAN) communications bands such as the 2.4 GHz Bluetooth® communications band, cellular telephone communications bands such as a cellular low band (LB) (e.g., 600 to 960 MHz), a cellular low-midband (LMB) (e.g., 1400 to 1550 MHz), a cellular midband (MB) (e.g., from 1700 to 2200 MHz), a cellular high band (HB) (e.g., from 2300 to 2700 MHz), a cellular ultra-high band (UHB) (e.g., from 3300 to 5000 MHz, or other cellular communications bands between about 600 MHz and about 5000 MHz (e.g., 3G bands, 4G LTE bands, 5G New Radio Frequency Range 1 (FR1) bands below 10 GHz, etc.), a near-field communications (NFC) band (e.g., at 13.56 MHz), satellite navigations bands (e.g., an L1 global positioning system (GPS) band at 1575 MHz, an L5 GPS band at 1176 MHz, a Global Navigation Satellite System (GLONASS) band, a BeiDou Navigation Satellite System (BDS) band, etc.), ultra-wideband (UWB) communications band(s) supported by the IEEE 802.15.4 protocol and/or other UWB communications protocols (e.g., a first UWB communications band at 6.5 GHz and/or a second UWB communications band at 8.0 GHz), and/or any other desired communications bands. The communications bands handled by the radio-frequency transceiver circuitry may sometimes be referred to herein as frequency bands or simply as "bands," and may span corresponding ranges of frequencies. Non-millimeter/centimeter wave transceiver circuitry 36 and millimeter/centimeter wave transceiver circuitry 38 may each include one or more integrated circuits, power amplifier circuitry, low-noise input amplifiers, passive radio-frequency components, switching circuitry, transmission line structures, and other circuitry for handling radio-frequency signals.

In general, the transceiver circuitry in wireless circuitry 34 may cover (handle) any desired frequency bands of interest. As shown in FIG. 2, wireless circuitry 34 may include antennas 40. The transceiver circuitry may convey radio-frequency signals using one or more antennas 40 (e.g., antennas 40 may convey the radio-frequency signals for the transceiver circuitry). The term "convey radio-frequency signals" as used herein means the transmission and/or reception of the radio-frequency signals (e.g., for performing unidirectional and/or bidirectional wireless communications with external wireless communications equipment). Antennas 40 may transmit the radio-frequency signals by radiating the radio-frequency signals into free space (or to freespace through intervening device structures such as a dielectric cover layer). Antennas 40 may additionally or alternatively receive the radio-frequency signals from free space (e.g., through intervening devices structures such as a dielectric cover layer). The transmission and reception of radio-frequency signals by antennas 40 each involve the excitation or resonance of antenna currents on an antenna resonating element in the antenna by the radio-frequency signals within the frequency band(s) of operation of the antenna.

In satellite navigation system links, cellular telephone links, and other long-range links, radio-frequency signals are typically used to convey data over thousands of feet or miles. In Wi-Fi® and Bluetooth® links at 2.4 and 5 GHz and other short-range wireless links, radio-frequency signals are typically used to convey data over tens or hundreds of feet. Millimeter/centimeter wave transceiver circuitry 38 may convey radio-frequency signals over short distances that travel over a line-of-sight path. To enhance signal reception for millimeter and centimeter wave communications, phased antenna arrays and beam forming (steering) techniques may be used (e.g., schemes in which antenna signal phase and/or magnitude for each antenna in an array are adjusted to perform beam steering). Antenna diversity schemes may also be used to ensure that the antennas that have become blocked or that are otherwise degraded due to the operating environment of device 10 can be switched out of use and higher-performing antennas used in their place.

Antennas 40 in wireless circuitry 34 may be formed using any suitable antenna types. For example, antennas 40 may include antennas with resonating elements that are formed from stacked patch antenna structures, loop antenna structures, patch antenna structures, inverted-F antenna structures, slot antenna structures, planar inverted-F antenna structures, monopole antenna structures, dipole antenna structures, helical antenna structures, Yagi (Yagi-Uda) antenna structures, hybrids of these designs, etc. In another suitable arrangement, antennas 40 may include antennas with dielectric resonating elements such as dielectric resonator antennas. If desired, one or more of antennas 40 may be cavity-backed antennas. Different types of antennas may be used for different bands and combinations of bands. For example, one type of antenna may be used in forming a non-millimeter/centimeter wave wireless link for non-millimeter/centimeter wave transceiver circuitry 36 and another type of antenna may be used in conveying radio-frequency signals at millimeter and/or centimeter wave frequencies for millimeter/centimeter wave transceiver circuitry 38. Antennas 40 that are used to convey radio-frequency signals at millimeter and centimeter wave frequencies may be arranged in one or more phased antenna arrays.

Figure 3:
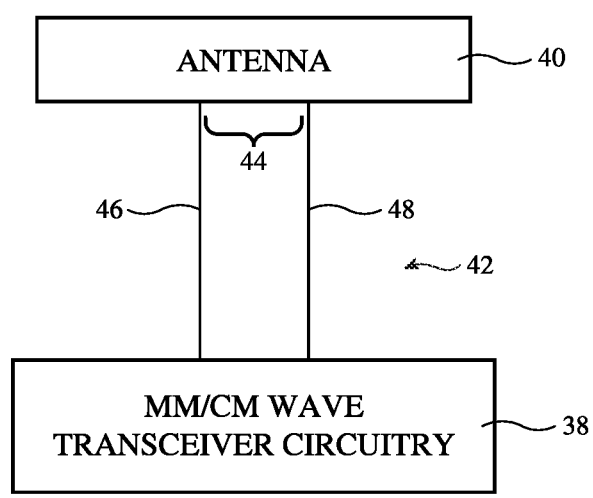
FIG. 3 is a schematic diagram of illustrative wireless circuitry in accordance with some embodiments.

A schematic diagram of an antenna 40 that may be formed in a phased antenna array for conveying radio-frequency signals at millimeter and centimeter wave frequencies is shown in FIG. 3. As shown in FIG. 3, antenna 40 may be coupled to millimeter/centimeter (MM/CM) wave transceiver circuitry 38. Millimeter/centimeter wave transceiver circuitry 38 may be coupled to antenna feed 44 of antenna 40 using a transmission line path that includes radio-frequency transmission line 42. Radio-frequency transmission line 42 may include a positive signal conductor such as signal conductor 46 and may include a ground conductor such as ground conductor 48. Ground conductor 48 may be coupled to the antenna ground for antenna 40 (e.g., over a ground antenna feed terminal of antenna feed 44 located at the antenna ground). Signal conductor 46 may be coupled to the antenna resonating element for antenna 40. For example, signal conductor 46 may be coupled to a positive antenna feed terminal of antenna feed 44 located at the antenna resonating element.

In another suitable arrangement, antenna 40 may be a probe-fed antenna that is fed using a feed probe. In this arrangement, antenna feed 44 may be implemented as a feed probe. Signal conductor 46 may be coupled to the feed probe. Radio-frequency transmission line 42 may convey radio-frequency signals to and from the feed probe. When radio-frequency signals are being transmitted over the feed probe and the antenna, the feed probe may excite the resonating element for the antenna (e.g., may excite electromagnetic resonant modes of a dielectric antenna resonating element for antenna 40). The resonating element may radiate the radio-frequency signals in response to excitation by the feed probe. Similarly, when radio-frequency signals are received by the antenna (e.g., from free space), the radio-frequency signals may excite the resonating element for the antenna (e.g., may excite electromagnetic resonant modes of the dielectric antenna resonating element for antenna 40). This may produce antenna currents on the feed probe and the corresponding radio-frequency signals may be passed to the transceiver circuitry over the radio-frequency transmission line.

Radio-frequency transmission line 42 may include a stripline transmission line (sometimes referred to herein simply as a stripline), a coaxial cable, a coaxial probe realized by metalized vias, a microstrip transmission line, an edge-coupled microstrip transmission line, an edge-coupled stripline transmission lines, a waveguide structure, combinations of these, etc. Multiple types of transmission lines may be used to form the transmission line path that couples millimeter/centimeter wave transceiver circuitry 38 to antenna feed 44. Filter circuitry, switching circuitry, impedance matching circuitry, phase shifter circuitry, amplifier circuitry, and/or other circuitry may be interposed on radio-frequency transmission line 42, if desired.

Radio-frequency transmission lines in device 10 may be integrated into ceramic substrates, rigid printed circuit boards, and/or flexible printed circuits. In one suitable arrangement, radio-frequency transmission lines in device 10 may be integrated within multilayer laminated structures (e.g., layers of a conductive material such as copper and a dielectric material such as a resin that are laminated together without intervening adhesive) that may be folded or bent in multiple dimensions (e.g., two or three dimensions) and that maintain a bent or folded shape after bending (e.g., the multilayer laminated structures may be folded into a particular three-dimensional shape to route around other device components and may be rigid enough to hold its shape after folding without being held in place by stiffeners or other structures). All of the multiple layers of the laminated structures may be batch laminated together (e.g., in a single pressing process) without adhesive (e.g., as opposed to performing multiple pressing processes to laminate multiple layers together with adhesive).

Figure 4:
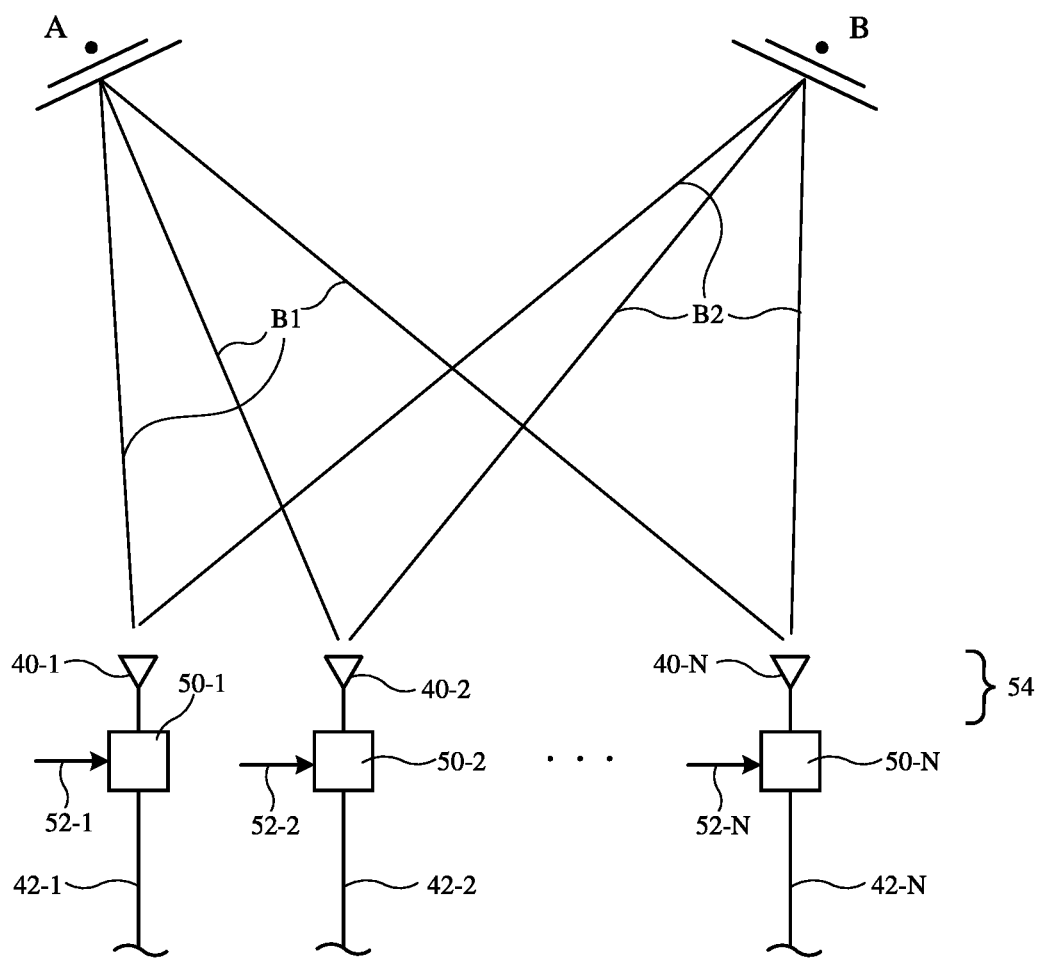
FIG. 4 is a diagram of an illustrative phased antenna array in accordance with some embodiments.

FIG. 4 shows how antennas 40 for handling radio-frequency signals at millimeter and centimeter wave frequencies may be formed in a phased antenna array. As shown in FIG. 4, phased antenna array 54 (sometimes referred to herein as array 54, antenna array 54, or array 54 of antennas 40) may be coupled to radio-frequency transmission lines 42. For example, a first antenna 40-1 in phased antenna array 54 may be coupled to a first radio-frequency transmission line 42-1, a second antenna 40-2 in phased antenna array 54 may be coupled to a second radio-frequency transmission line 42-2, an Nth antenna 40-N in phased antenna array 54 may be coupled to an Nth radio-frequency transmission line 42-N, etc. While antennas 40 are described herein as forming a phased antenna array, the antennas 40 in phased antenna array 54 may sometimes also be referred to as collectively forming a single phased array antenna.

Antennas 40 in phased antenna array 54 may be arranged in any desired number of rows and columns or in any other desired pattern (e.g., the antennas need not be arranged in a grid pattern having rows and columns). During signal transmission operations, radio-frequency transmission lines 42 may be used to supply signals (e.g., radio-frequency signals such as millimeter wave and/or centimeter wave signals) from millimeter/centimeter wave transceiver circuitry 38 (FIG. 3) to phased antenna array 54 for wireless transmission. During signal reception operations, radio-frequency transmission lines 42 may be used to supply signals received at phased antenna array 54 (e.g., from external wireless equipment or transmitted signals that have been reflected off of external objects) to millimeter/centimeter wave transceiver circuitry 38 (FIG. 3).

The use of multiple antennas 40 in phased antenna array 54 allows beam steering arrangements to be implemented by controlling the relative phases and magnitudes (amplitudes) of the radio-frequency signals conveyed by the antennas. In the example of FIG. 4, antennas 40 each have a corresponding radio-frequency phase and magnitude controller 50 (e.g., a first phase and magnitude controller 50-1 interposed on radio-frequency transmission line 42-1 may control phase and magnitude for radio-frequency signals handled by antenna 40-1, a second phase and magnitude controller 50-2 interposed on radio-frequency transmission line 42-2 may control phase and magnitude for radio-frequency signals handled by antenna 40-2, an Nth phase and magnitude controller 50-N interposed on radio-frequency transmission line 42-N may control phase and magnitude for radio-frequency signals handled by antenna 40-N, etc.).

Phase and magnitude controllers 50 may each include circuitry for adjusting the phase of the radio-frequency signals on radio-frequency transmission lines 42 (e.g., phase shifter circuits) and/or circuitry for adjusting the magnitude of the radio-frequency signals on radio-frequency transmission lines 42 (e.g., power amplifier and/or low noise amplifier circuits). Phase and magnitude controllers 50 may sometimes be referred to collectively herein as beam steering circuitry (e.g., beam steering circuitry that steers the beam of radio-frequency signals transmitted and/or received by phased antenna array 54).

Phase and magnitude controllers 50 may adjust the relative phases and/or magnitudes of the transmitted signals that are provided to each of the antennas in phased antenna array 54 and may adjust the relative phases and/or magnitudes of the received signals that are received by phased antenna array 54. Phase and magnitude controllers 50 may, if desired, include phase detection circuitry for detecting the phases of the received signals that are received by phased antenna array 54. The term "beam" or "signal beam" may be used herein to collectively refer to wireless signals that are transmitted and received by phased antenna array 54 in a particular direction. The signal beam may exhibit a peak gain that is oriented in a particular pointing direction at a corresponding pointing angle (e.g., based on constructive and destructive interference from the combination of signals from each antenna in the phased antenna array). The term "transmit beam" may sometimes be used herein to refer to radio-frequency signals that are transmitted in a particular direction whereas the term "receive beam" may sometimes be used herein to refer to radio-frequency signals that are received from a particular direction.

If, for example, phase and magnitude controllers 50 are adjusted to produce a first set of phases and/or magnitudes for transmitted radio-frequency signals, the transmitted signals will form a transmit beam as shown by beam B1 of FIG. 4 that is oriented in the direction of point A. If, however, phase and magnitude controllers 50 are adjusted to produce a second set of phases and/or magnitudes for the transmitted signals, the transmitted signals will form a transmit beam as shown by beam B2 that is oriented in the direction of point B. Similarly, if phase and magnitude controllers 50 are adjusted to produce the first set of phases and/or magnitudes, radio-frequency signals (e.g., radio-frequency signals in a receive beam) may be received from the direction of point A, as shown by beam B1. If phase and magnitude controllers 50 are adjusted to produce the second set of phases and/or magnitudes, radio-frequency signals may be received from the direction of point B, as shown by beam B2.

Each phase and magnitude controller 50 may be controlled to produce a desired phase and/or magnitude based on a corresponding control signal 52 received from control circuitry 28 of FIG. 2 (e.g., the phase and/or magnitude provided by phase and magnitude controller 50-1 may be controlled using control signal 52-1, the phase and/or magnitude provided by phase and magnitude controller 50-2 may be controlled using control signal 52-2, etc.). If desired, the control circuitry may actively adjust control signals 52 in real time to steer the transmit or receive beam in different desired directions over time. Phase and magnitude controllers 50 may provide information identifying the phase of received signals to control circuitry 28 if desired.

When performing wireless communications using radio-frequency signals at millimeter and centimeter wave frequencies, the radio-frequency signals are conveyed over a line of sight path between phased antenna array 54 and external communications equipment. If the external object is located at point A of FIG. 4, phase and magnitude controllers 50 may be adjusted to steer the signal beam towards point A (e.g., to steer the pointing direction of the signal beam towards point A). Phased antenna array 54 may transmit and receive radio-frequency signals in the direction of point A. Similarly, if the external communications equipment is located at point B, phase and magnitude controllers 50 may be adjusted to steer the signal beam towards point B (e.g., to steer the pointing direction of the signal beam towards point B). Phased antenna array 54 may transmit and receive radio-frequency signals in the direction of point B. In the example of FIG. 4, beam steering is shown as being performed over a single degree of freedom for the sake of simplicity (e.g., towards the left and right on the page of FIG. 4). However, in practice, the beam may be steered over two or more degrees of freedom (e.g., in three dimensions, into and out of the page and to the left and right on the page of FIG. 4). Phased antenna array 54 may have a corresponding field of view over which beam steering can be performed (e.g., in a hemisphere or a segment of a hemisphere over the phased antenna array). If desired, device 10 may include multiple phased antenna arrays that each face a different direction to provide coverage from multiple sides of the device.

Figure 5:
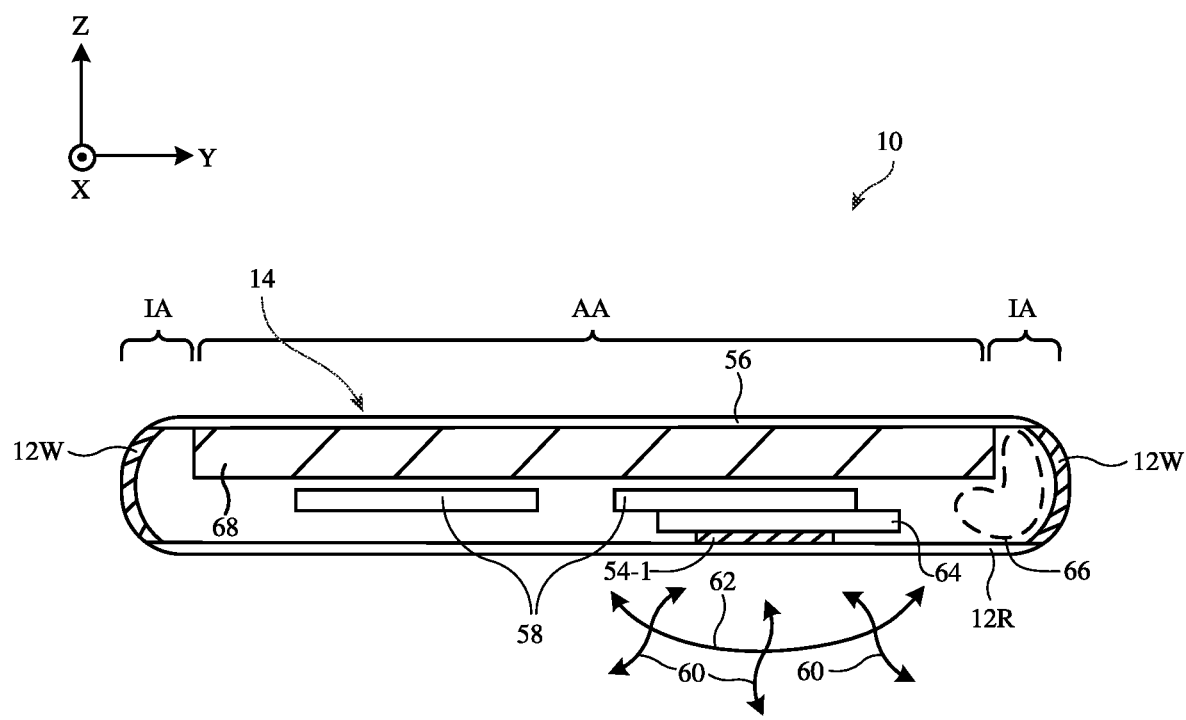
FIG. 5 is a cross-sectional side view of an illustrative electronic device having phased antenna arrays for radiating through different sides of the device in accordance with some embodiments.

FIG. 5 is a cross-sectional side view of device 10 in an example where device 10 has multiple phased antenna arrays. As shown in FIG. 5, peripheral conductive housing structures 12W may extend around the (lateral) periphery of device 10 and may extend from rear housing wall 12R to display 14. Display 14 may have a display module such as display module 68 (sometimes referred to as a display panel). Display module 68 may include pixel circuitry, touch sensor circuitry, force sensor circuitry, and/or any other desired circuitry for forming active area AA of display 14. Display 14 may include a dielectric cover layer such as display cover layer 56 that overlaps display module 68. Display module 68 may emit image light and may receive sensor input through display cover layer 56. Display cover layer 56 and display 14 may be mounted to peripheral conductive housing structures 12W. The lateral area of display 14 that does not overlap display module 68 may form inactive area IA of display 14.

Device 10 may include multiple phased antenna arrays 54 such as a rear-facing phased antenna array 54-1. As shown in FIG. 5, phased antenna array 54-1 may transmit and receive radio-frequency signals 60 at millimeter and centimeter wave frequencies through rear housing wall 12R. In scenarios where rear housing wall 12R includes metal portions, radio-frequency signals 60 may be conveyed through an aperture or opening in the metal portions of rear housing wall 12R or may be conveyed through other dielectric portions of rear housing wall 12R. The aperture may be overlapped by a dielectric cover layer or dielectric coating that extends across the lateral area of rear housing wall 12R (e.g., between peripheral conductive housing structures 12W). Phased antenna array 54-1 may perform beam steering for radio-frequency signals 60 across the hemisphere below device 10, as shown by arrow 62.

Phased antenna array 54-1 may be mounted to a substrate such as substrate 64. Substrate 64 may be an integrated circuit chip, a flexible printed circuit, a rigid printed circuit board, or other substrate. Substrate 64 may sometimes be referred to herein as antenna module 64. If desired, transceiver circuitry (e.g., millimeter/centimeter wave transceiver circuitry 38 of FIG. 2) may be mounted to antenna module 64. Phased antenna array 54-1 may be adhered to rear housing wall 12R using adhesive, may be pressed against (e.g., in contact with) rear housing wall 12R, or may be spaced apart from rear housing wall 12R.

The field of view of phased antenna array 54-1 is limited to the hemisphere under the rear face of device 10. Display module 68 and other components 58 (e.g., portions of input-output circuitry 24 or control circuitry 28 of FIG. 2, a battery for device 10, etc.) in device 10 include conductive structures. If care is not taken, these conductive structures may block radio-frequency signals from being conveyed by a phased antenna array within device 10 across the hemisphere over the front face of device 10. While an additional phased antenna array for covering the hemisphere over the front face of device 10 may be mounted against display cover layer 56 within inactive area IA, there may be insufficient space between the lateral periphery of display module 68 and peripheral conductive housing structures 12W to form all of the circuitry and radio-frequency transmission lines necessary to fully support the phased antenna array.

To mitigate these issues and provide coverage through the front face of device 10, a front-facing phased antenna array may be mounted within peripheral region 66 of device 10. The antennas in the front-facing phased antenna array may include dielectric resonator antennas. Dielectric resonator antennas may occupy less area in the X-Y plane of FIG. 5 than other types of antennas such as patch antennas and slot antennas. Implementing the antennas as dielectric resonator antennas may allow the radiating elements of the front-facing phased antenna array to fit within inactive area IA between display module 68 and peripheral conductive housing structures 12W. At the same time, the radio-frequency transmission lines and other components for the phased antenna array may be located behind (under) display module 68. While examples are described herein in which the phased antenna array is a front-facing phased antenna array that radiates through display 14, in another suitable arrangement, the phased antenna array may be a side-facing phased antenna array that radiates through one or more apertures in peripheral conductive housing structures 12W.

Figure 6:
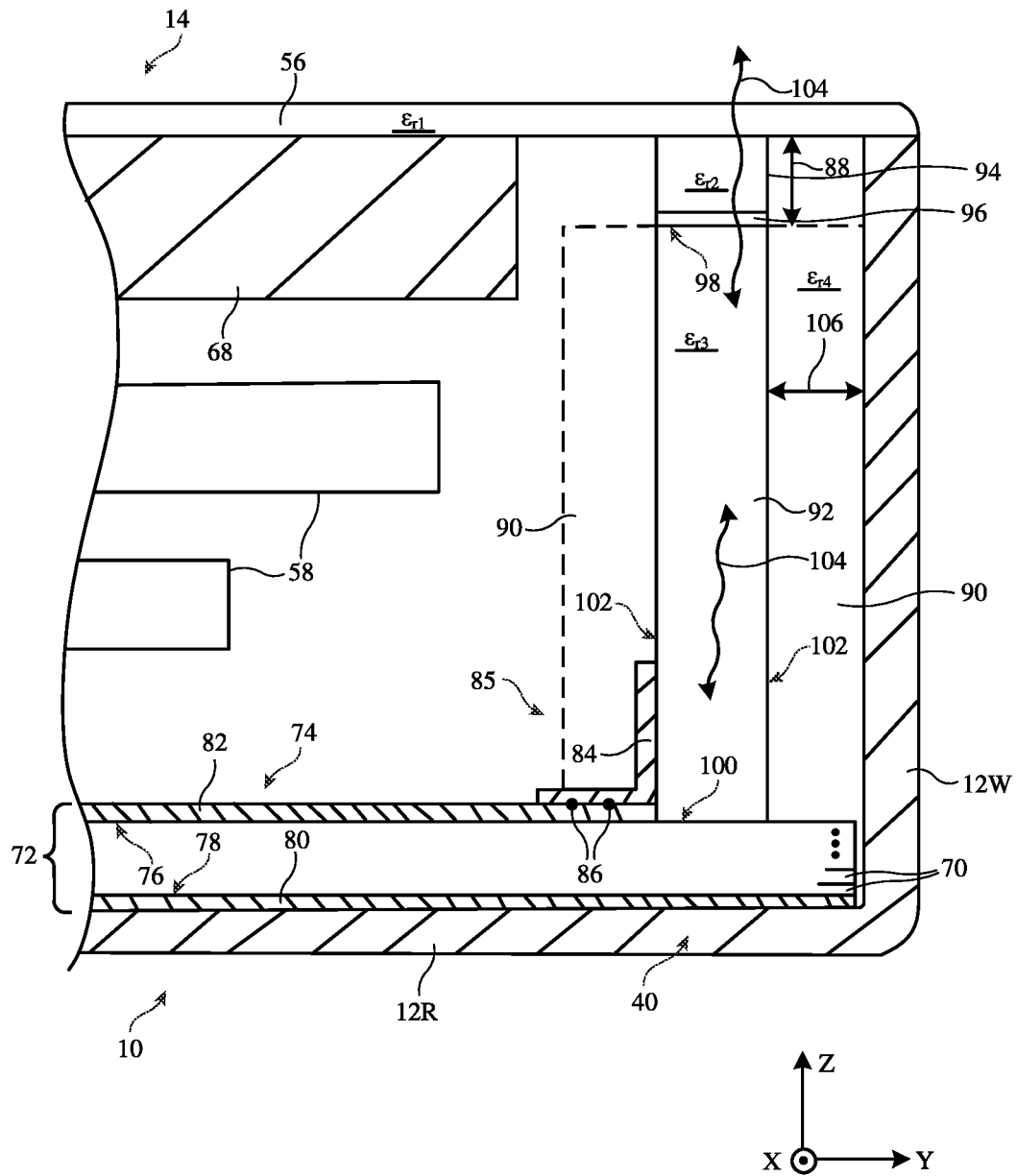
FIG. 6 is a cross-sectional side view of an illustrative dielectric resonator antenna that may be mounted within an electronic device in accordance with some embodiments.

FIG. 6 is a cross-sectional side view of an illustrative dielectric resonator antenna in a front-facing phased antenna array for device 10. As shown in FIG. 6, device 10 may include a front-facing phased antenna array having a given antenna 40 (e.g., mounted within peripheral region 66 of FIG. 5). Antenna 40 of FIG. 6 may be a dielectric resonator antenna. In this example, antenna 40 includes a dielectric resonating element 92 mounted to an underlying substrate such as circuit board 72. Circuit board 72 may be a flexible printed circuit or a rigid printed circuit board, as examples.

Circuit board 72 has a lateral area (e.g., in the X-Y plane of FIG. 6) that extends along rear housing wall 12R. Circuit board 72 may be adhered to rear housing wall 12R using adhesive, may be pressed against (e.g., placed in contact with) rear housing wall 12R, or may be separated from rear housing wall 12R. Circuit board 72 may have a first end at antenna 40 and an opposing second end coupled to the millimeter/centimeter wave transceiver circuitry in device 10 (e.g., millimeter/centimeter wave transceiver circuitry 38 of FIG. 2). In one suitable arrangement, the second end of circuit board 72 may be coupled to antenna module 64 of FIG. 5.

As shown in FIG. 6, circuit board 72 may include stacked dielectric layers 70. Dielectric layers 70 may include polyimide, ceramic, liquid crystal polymer, plastic, and/or any other desired dielectric materials. Conductive traces such as conductive traces 82 may be patterned on a top surface 76 of circuit board 72. Conductive traces such as conductive traces 80 may be patterned on an opposing bottom surface 78 of circuit board 72 or elsewhere within circuit board 72. Conductive traces 80 may be held at a ground potential and may therefore sometimes be referred to herein as ground traces 80. Ground traces 80 may be shorted to additional ground traces within circuit board 72 and/or on top surface 76 of circuit board 72 using conducive vias that extend through circuit board 72 (not shown in FIG. 6 for the sake of clarity). Ground traces 80 may form part of the antenna ground for antenna 40. Ground traces 80 may be coupled to a system ground in device 10 (e.g., using solder, welds, conductive adhesive, conductive tape, conductive brackets, conductive pins, conductive screws, conductive clips, combinations of these, etc.). For example, ground traces 80 may be coupled to peripheral conductive housing structures 12W, conductive portions of rear housing wall 12R, or other grounded structures in device 10. The example of FIG. 6 in which conductive traces 82 are formed on top surface 76 and ground traces 80 are formed on bottom surface 78 of circuit board 72 is merely illustrative. If desired, one or more dielectric layers 70 may be layered over conductive traces 82 and/or one or more dielectric layers 70 may be layered underneath ground traces 80.

Antenna 40 may be fed using a radio-frequency transmission line that is formed on and/or embedded within circuit board 72 such as radio-frequency transmission line 74. Radio-frequency transmission line 74 (e.g., a given radio-frequency transmission line 42 of FIG. 3) may include ground traces 80 and conductive traces 82. The portion of ground traces 80 overlapping conductive traces 82 may form the ground conductor for radio-frequency transmission line 74 (e.g., ground conductor 48 of FIG. 3). Conductive traces 82 may form the signal conductor for radio-frequency transmission line 74 (e.g., signal conductor 46 of FIG. 3) and may therefore sometimes be referred to herein as signal traces 82. Radio-frequency transmission line 74 may convey radio-frequency signals between antenna 40 and the millimeter/centimeter wave transceiver circuitry. The example of FIG. 6 in which antenna 40 is fed using signal traces 82 and ground traces 80 is merely illustrative. In general, antenna 40 may be fed using any desired transmission line structures in and/or on circuit board 72.

Dielectric resonating element 92 of antenna 40 may be formed from a column (pillar) of dielectric material mounted to top surface 76 of circuit board 72. If desired, dielectric resonating element 92 may be embedded within (e.g., laterally surrounded by) a dielectric substrate mounted to top surface 76 of circuit board 72 such as dielectric substrate 90. Dielectric resonating element 92 may have a first (bottom) surface 100 at circuit board 72 to and an opposing second (top) surface 98 at display 14. Bottom surface 100 may sometimes be referred to as bottom end 100, bottom face 100, proximal end 100, or proximal surface 100 of dielectric resonating element 92. Similarly, top surface 98 may sometimes be referred to herein as top end 98, top face 98, distal end 98, or distal surface 98 of dielectric resonating element 92. Dielectric resonating element 92 may have vertically extending sidewalls 102 that extend from top surface 98 to bottom surface 100. Dielectric resonating element 92 may extend along a central/longitudinal axis (e.g., parallel to the Z-axis) that runs through the center of both top surface 98 and bottom surface 100. The length of dielectric resonating element 92 (e.g., as measured parallel to the longitudinal axis and the Z-axis of FIG. 6) may be greater than the width/thickness of dielectric resonating element 92 (e.g., as measured parallel to the X-axis and Y-axis of FIG. 6).

The operating (resonant) frequency of antenna 40 may be selected by adjusting the dimensions of dielectric resonating element 92 (e.g., in the direction of the X, Y, and/or Z axes of FIG. 6), which adjusts the resonance and boundary conditions of one or more electromagnetic modes of electromagnetic energy within the dielectric resonating element. Dielectric resonating element 92 may be formed from a column of dielectric material having dielectric constant $\varepsilon_{r3}$. Dielectric constant $\varepsilon_{r3}$ may be relatively high (e.g., greater than 10.0, greater than 12.0, greater than 15.0, greater than 20.0, between 15.0 and 40.0, between 10.0 and 50.0, between 18.0 and 30.0, between 12.0 and 45.0, etc.). In one suitable arrangement, dielectric resonating element 92 may be formed from zirconia or a ceramic material. Other dielectric materials may be used to form dielectric resonating element 92 if desired.

Dielectric substrate 90 may be formed from a material having dielectric constant $\varepsilon_{r4}$. Dielectric constant $\varepsilon_{r4}$ may be less than dielectric constant $\varepsilon_{r3}$ of dielectric resonating element 92 (e.g., less than 18.0, less than 15.0, less than 10.0, between 3.0 and 4.0, less than 5.0, between 2.0 and 5.0, etc.). Dielectric constant $\varepsilon_{r4}$ may be less than dielectric constant $\varepsilon_{r3}$ by at least 10.0, 5.0, 15.0, 12.0, 6.0, etc. In one suitable arrangement, dielectric substrate 90 may be formed from molded plastic (e.g., injection-molded plastic). The molded plastic in dielectric substrate 90 may be molded over dielectric resonating element 92 after dielectric resonating element 92 has been mounted or affixed to circuit board 72, for example. Dielectric substrate 90 may therefore sometimes also be referred to herein as plastic overmold 90. Other dielectric materials may be used to form dielectric substrate 90 or dielectric substrate 90 may be omitted if desired. The difference in dielectric constant between dielectric resonating element 92 and dielectric substrate 90 may establish a radio-frequency boundary condition between dielectric resonating element 92 and dielectric substrate 90 from bottom surface 100 to top surface 98. This may configure dielectric resonating element 92 to serve as a waveguide for propagating radio-frequency signals at millimeter and centimeter wave frequencies.

Dielectric substrate 90 may have a width (thickness) 106 on each side of dielectric resonating element 92. Width 106 may be selected to isolate dielectric resonating element 92 from peripheral conductive housing structures 12W and to minimize signal reflections in dielectric substrate 90. Width 106 may be, for example, at least one-tenth of the effective wavelength of the radio-frequency signals in a dielectric material of dielectric constant $\varepsilon_{r4}$. Width 106 may be 0.4-0.5 mm, 0.3-0.5 mm, 0.2-0.6 mm, greater than 0.1 mm, greater than 0.3 mm, 0.2-2.0 mm, 0.3-1.0 mm, or greater than between 0.4 and 0.5 mm, as examples. The example of FIG. 6 in which width 106 is constant across the height of dielectric resonating element 92 is merely illustrative.

Dielectric resonating element 92 may radiate radio-frequency signals 104 when excited by the signal conductor for radio-frequency transmission line 74. In some scenarios, a slot is formed in ground traces on top surface 76 of flexible printed circuit, the slot is indirectly fed by a signal conductor embedded within circuit board 72, and the slot excites dielectric resonating element 92 to radiate radio-frequency signals 104. However, in these scenarios, the radiating characteristics of the antenna may be affected by how the dielectric resonating element is mounted to circuit board 72. For example, air gaps or layers of adhesive used to mount the dielectric resonating element to the flexible printed circuit can be difficult to control and can undesirably affect the radiating characteristics of the antenna. To mitigate the issues associated with exciting dielectric resonating element 92 using an underlying slot, antenna 40 may be fed using a radio-frequency feed probe such as feed probe 85. Feed probe 85 may form part of the antenna feed for antenna 40 (e.g., antenna feed 44 of FIG. 3).

As shown in FIG. 6, feed probe 85 may include feed conductor 84. Feed conductor 84 may include a first portion on a given sidewall 102 of dielectric resonating element 92. Feed conductor 84 may be formed from a patch of stamped sheet metal that is pressed against sidewall 102 (e.g., by biasing structures and/or dielectric substrate 90). In another suitable arrangement, feed conductor 84 may be formed from conductive traces that are patterned directly onto sidewall 102 (e.g., using a sputtering process, a laser direct structuring process, or other conductive deposition techniques). Feed conductor 84 may include a second portion coupled to signal traces 82 using conductive interconnect structures 86. Conductive interconnect structures 86 may include solder, welds, conductive adhesive, conductive tape, conductive foam, conductive springs, conductive brackets, and/or any other desired conductive interconnect structures. As one example, feed probe 85 may be pressed or mounted to dielectric resonating element 92, dielectric resonating element 92 may then be molded within dielectric substrate 90 (e.g., dielectric substrate 90 may be molded over feed probe 85 and dielectric resonating element 92), and feed probe 85 may be soldered to signal traces 86 to surface-mount antenna 40 (e.g., dielectric resonating element 92 and dielectric substrate 90) to circuit board 72.

Signal traces 82 may convey radio-frequency signals to and from feed probe 85. Feed probe 85 may electromagnetically couple the radio-frequency signals on signal traces 82 into dielectric resonating element 92. This may serve to excite one or more electromagnetic modes of dielectric resonating element 92 (e.g., radio-frequency cavity or waveguide modes). When excited by feed probe 85, the electromagnetic modes of dielectric resonating element 92 may configure the dielectric resonating element to serve as a waveguide that propagates the wavefronts of radio-frequency signals 104 along the length of dielectric resonating element 92 (e.g., in the direction of the Z-axis of FIG. 6), through top surface 98, and through display 14.

For example, during signal transmission, radio-frequency transmission line 74 may supply radio-frequency signals from the millimeter/centimeter wave transceiver circuitry to antenna 40. Feed probe 85 may couple the radio-frequency signals on signal traces 82 into dielectric resonating element 92. This may serve to excite one or more electromagnetic modes of dielectric resonating element 92, resulting in the propagation of radio-frequency signals 104 up the length of dielectric resonating element 92 and to the exterior of device 10 through display cover layer 56. Similarly, during signal reception, radio-frequency signals 104 may be received through display cover layer 56. The received radio-frequency signals may excite the electromagnetic modes of dielectric resonating element 92, resulting in the propagation of the radio-frequency signals down the length of dielectric resonating element 92. Feed probe 85 may couple the received radio-frequency signals onto radio-frequency transmission line 74, which passes the radio-frequency signals to the millimeter/centimeter wave transceiver circuitry. The relatively large difference in dielectric constant between dielectric resonating element 92 and dielectric substrate 90 may allow dielectric resonating element 92 to convey radio-frequency signals 104 with a relatively high antenna efficiency (e.g., by establishing a strong boundary between dielectric resonating element 92 and dielectric substrate 90 for the radio-frequency signals). The relatively high dielectric constant of dielectric resonating element 92 may also allow the dielectric resonating element 92 to occupy a relatively small volume compared to scenarios where materials with a lower dielectric constant are used.

The dimensions of feed probe 85 (e.g., in the direction of the X-axis and Z-axis of FIG. 6) may be selected to help match the impedance of radio-frequency transmission line 74 to the impedance of dielectric resonating element 92. Feed probe 85 may be located on a particular sidewall 102 of dielectric resonating element 92 to provide antenna 40 with a desired linear polarization (e.g., a vertical or horizontal polarization). If desired, multiple feed probes 85 may be formed on multiple sidewalls 102 of dielectric resonating element 92 to configure antenna 40 to cover multiple orthogonal linear polarizations at once. The phase of each feed probe may be independently adjusted over time to provide the antenna with other polarizations such as an elliptical or circular polarization if desired. Feed probe 85 may sometimes be referred to herein as feed conductor 85, feed patch 85, or probe feed 85. Dielectric resonating element 92 may sometimes be referred to herein as a dielectric radiating element, dielectric radiator, dielectric resonator, dielectric antenna resonating element, dielectric column, dielectric pillar, radiating element, or resonating element. When fed by one or more feed probes such as feed probe 85, dielectric resonator antennas such as antenna 40 of FIG. 6 may sometimes be referred to herein as probe-fed dielectric resonator antennas.

Display cover layer 56 may be formed from a dielectric material having dielectric constant $\varepsilon_{r1}$ that is less than dielectric constant $\varepsilon_{r3}$. For example, dielectric constant $\varepsilon_{r1}$ may be between about 3.0 and 10.0 (e.g., between 4.0 and 9.0, between 5.0 and 8.0, between 5.5 and 7.0, between 5.0 and 7.0, etc.). In one suitable arrangement, display cover layer 56 may be formed from glass, plastic, or sapphire. If care is not taken, the relatively large difference in dielectric constant between display cover layer 56 and dielectric resonating element 92 may cause undesirable signal reflections at the boundary between the display cover layer and the dielectric resonating element. These reflections may result in destructive interference between the transmitted and reflected signals and in stray signal loss that undesirably limits the antenna efficiency of antenna 40.

To mitigate these effects, antenna 40 may be provided with an impedance matching layer such as dielectric matching layer 94. Dielectric matching layer 94 may be mounted to top surface 98 of dielectric resonating element 92 between dielectric resonating element 92 and display cover layer 56. If desired, dielectric matching layer 94 may be adhered to dielectric resonating element 92 using a layer of adhesive 96. Adhesive may also or alternatively be used to adhere dielectric matching layer 94 to display cover layer 56 if desired. Adhesive 96 may be relatively thin so as not to significantly affect the propagation of radio-frequency signals 104.

Dielectric matching layer 94 may be formed from a dielectric material having dielectric constant $\varepsilon_{r2}$. Dielectric constant Ea may be greater than dielectric constant $\varepsilon_{r1}$ and less than dielectric constant $\varepsilon_{r3}$. As an example, dielectric constant $\varepsilon_{r1}$ may be equal to SQRT($\varepsilon_{r1}*\varepsilon_{r3}$), where SQRT ( ) is the square root operator and "*" is the multiplication operator. The presence of dielectric matching layer 94 may allow radio-frequency signals to propagate without facing a sharp boundary between the material of dielectric constant $\varepsilon_{r1}$ and the material of dielectric constant $\varepsilon_{r3}$, thereby helping to reduce signal reflections.

Dielectric matching layer 94 may be provided with thickness 88. Thickness 88 may be selected to be approximately equal to (e.g., within 15% of) one-quarter of the effective wavelength of radio-frequency signals 104 in dielectric matching layer 94. The effective wavelength is given by dividing the free space wavelength of radio-frequency signals 104 (e.g., a centimeter or millimeter wavelength corresponding to a frequency between 10 GHz and 300 GHz) by a constant factor (e.g., the square root of $\varepsilon_{r2}$). When provided with thickness 88, dielectric matching layer 94 may form a quarter wave impedance transformer that mitigates any destructive interference associated with the reflection of radio-frequency signals 104 at the boundaries between display cover layer 56, dielectric matching layer 94, and dielectric resonating element 92. This is merely illustrative and dielectric matching layer 94 may be omitted if desired.

When configured in this way, antenna 40 may radiate radio-frequency signals 104 through the front face of device 10 despite being coupled to the millimeter/centimeter wave transceiver circuitry over a circuit board located at the rear of device 10. The relatively narrow width of dielectric resonating element 92 may allow antenna 40 to fit in the volume between display module 68, other components 58, and peripheral conductive housing structures 12W. Antenna 40 of FIG. 6 may be formed in a front-facing phased antenna array that conveys radio-frequency signals across at least a portion of the hemisphere above the front face of device 10.

Figure 7:
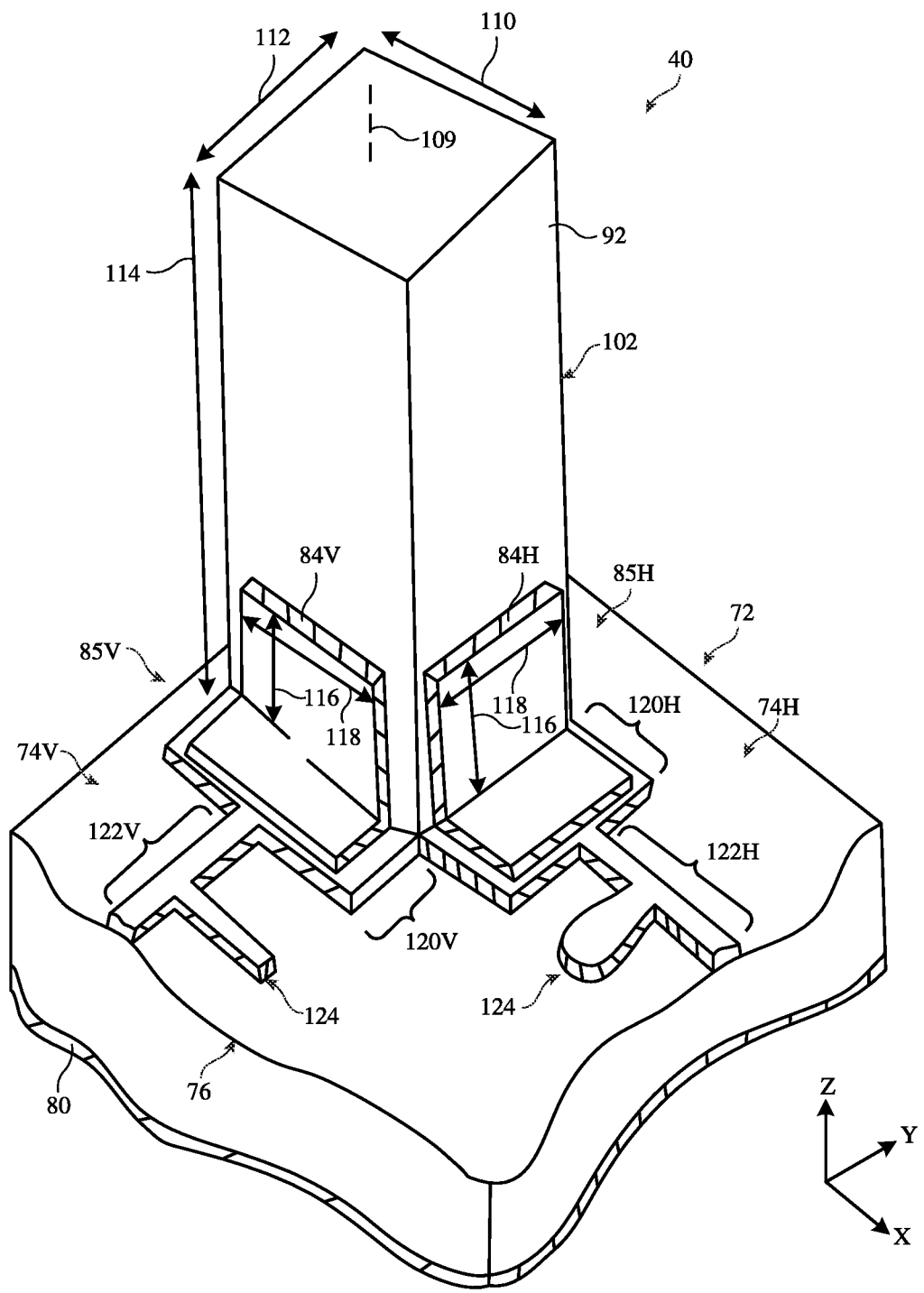
FIG. 7 is a perspective view of an illustrative dielectric resonator antenna in accordance with some embodiments.

FIG. 7 is a perspective view of the probe-fed dielectric resonator antenna of FIG. 6 in a scenario where the dielectric resonating element is fed using multiple feed probes for covering multiple polarizations. Peripheral conductive housing structures 12W, dielectric substrate 90, dielectric matching layer 94, adhesive 96, rear housing wall 12R, display 14, and other components 58 of FIG. 6 are omitted from FIG. 7 for the sake of clarity.

As shown in FIG. 7, dielectric resonating element 92 of antenna 40 (e.g., bottom surface 100 of FIG. 6) may be mounted to top surface 76 of circuit board 72. Antenna 40 may be fed using multiple feed probes 85 such as a first feed probe 85V and a second feed probe 85H mounted to dielectric resonating element 92 and circuit board 72. Feed probe 85V includes feed conductor 84V on a first sidewall 102 of dielectric resonating element 92. Feed probe 8511 includes feed conductor 84H on a second (orthogonal) sidewall 102 of dielectric resonating element 92.

Antenna 40 may be fed using multiple radio-frequency transmission lines 74 such as a first radio-frequency transmission line 74V and a second radio-frequency transmission line 74H. First radio-frequency transmission line 74V may include conductive traces 122V and 120V on top surface 76 of circuit board 72. Conductive traces 122V and 120V may form part of the signal conductor (e.g., signal traces 82 of FIG. 6) for radio-frequency transmission line 74V. Similarly, second radio-frequency transmission line 7411 may include conductive traces 12211 and 120H on top surface 76 of circuit board 72. Conductive traces 122H and 120H may form part of the signal conductor (e.g., signal traces 82 of FIG. 6) for radio-frequency transmission line 74H.

Conductive trace 122V may be narrower than conductive trace 120V. Conductive trace 122H may be narrower than conductive trace 120H. Conductive traces 120V and 120H may, for example, be conductive contact pads on top surface 76 of circuit board 72. Feed conductor 84V of feed probe 85V may be mounted and coupled to conductive trace 120V (e.g., using conductive interconnect structures 86 of FIG. 6). Similarly, feed conductor 8411 of feed probe 8511 may be mounted and coupled to conductive trace 120H.

Radio-frequency transmission line 74V and feed probe 85V may convey first radio-frequency signals having a first linear polarization (e.g., a vertical polarization). When driven using the first radio-frequency signals, feed probe 85V may excite one or more electromagnetic modes of dielectric resonating element 92 associated with the first polarization. When excited in this way, wave fronts associated with the first radio-frequency signals may propagate along the length of dielectric resonating element 92 (e.g., along central/longitudinal axis 109) and may be radiated through the display (e.g., through display cover layer 56 of FIG. 6). Sidewalls 102 may extend in the direction of central/longitudinal axis 109 (e.g., in the +Z direction). Central/longitudinal axis 109 may pass through the center of both the top and bottom surfaces of dielectric resonating element 92 (e.g., top surface 98 and bottom surface 100 of FIG. 6).

Similarly, radio-frequency transmission line 74H and feed probe 8511 may convey radio-frequency signals of a second linear polarization orthogonal to the first polarization (e.g., a horizontal polarization). When driven using the second radio-frequency signals, feed probe 85H may excite one or more electromagnetic modes of dielectric resonating element 92 associated with the second polarization. When excited in this way, wave fronts associated with the second radio-frequency signals may propagate along the length of dielectric resonating element 92 and may be radiated through the display (e.g., through display cover layer 56 of FIG. 6). Both feed probes 85H and 85V may be active at once so that antenna 40 conveys both the first and second radio-frequency signals at any given time. In another suitable arrangement, a single one of feed probes 85H and 85V may be active at once so that antenna 40 conveys radio-frequency signals of only a single polarization at any given time.

Dielectric resonating element 92 may have a first width 110, a second width (thickness) 112, and a height 114. First width 110, second width 112, and height 114 may be selected to provide dielectric resonating element 92 with a corresponding mix of electromagnetic cavity/waveguide modes that, when excited by feed probes 85H and/or 85V, configure antenna 40 to radiate at desired frequencies. For example, height 114 may be 2-10 mm, 4-6 mm, 3-7 mm, 4.5-5.5 mm, 3-4 mm, 3.5 mm, or greater than 2 mm. Second width 112 and first width 110 may each be 0.5-1.0 mm, 0.4-1.2 mm, 0.7-0.9 mm, 0.5-2.0 mm, 1.5 mm-2.5 mm, 1.7 mm-1.9 mm, 1.0 mm-3.0 mm, etc. Second width 112 may be equal to first width 110 or, in other arrangements, may be different than first width 110. Sidewalls 102 of dielectric resonating element 92 may contact the surrounding dielectric substrate (e.g., dielectric substrate 90 of FIG. 6). The dielectric substrate may be molded over feed probes 85H and 85V or may include openings, notches, or other structures that accommodate the presence of feed probes 85H and 85V. The example of FIG. 7 is merely illustrative and, if desired, dielectric resonating element 92 may have other shapes (e.g., shapes with any desired number of straight and/or curved sidewalls 102).

Feed conductors 84V and 84H may each have width 118 and height 116. Width 118 and height 116 may be selected to match the impedance of radio-frequency transmission lines 74V and 74H to the impedance of dielectric resonating element 92. As an example, width 118 may be between 0.3 mm and 0.7 mm, between 0.2 mm and 0.8 mm, between 0.4 mm and 0.6 mm, or other values. Height 116 may be between 0.3 mm and 0.7 mm, between 0.2 mm and 0.8 mm, between 0.4 mm and 0.6 mm, or other values. Height 116 may be equal to width 118 or may be different than width 118.

If desired, transmission lines 74V and 74H may include one or more transmission line matching stubs such as matching stubs 124 coupled to traces 122V and 122H. Matching stubs 124 may help to ensure that the impedance of radio-frequency transmission lines 74H and 74V are matched to the impedance of dielectric resonating element 92. Matching stubs 124 may have any desired shape or may be omitted. Feed conductors 84V and 84H may have other shapes (e.g., shapes having any desired number of straight and/or curved edges).

In general, it may be desirable for device 10 to exhibit as slim a thickness as possible (e.g., in the direction of the Z-axis of FIG. 6). However, mounting dielectric resonating element 92 within peripheral region 66 can undesirably limit reductions in the thickness of device 10. For example, the thickness of device 10 may be constrained by the height of dielectric resonating element 92 (e.g., height 114 of FIG. 7) required to configure antenna 40 to convey radio-frequency signals at desired frequencies and with desired antenna efficiency. To allow for further reductions in the thickness of device 10, the dielectric resonating elements 92 in peripheral region 66 of device 10 may be bent dielectric resonating elements (e.g., antenna 40 may be a bent dielectric resonator antenna).

Figure 8:
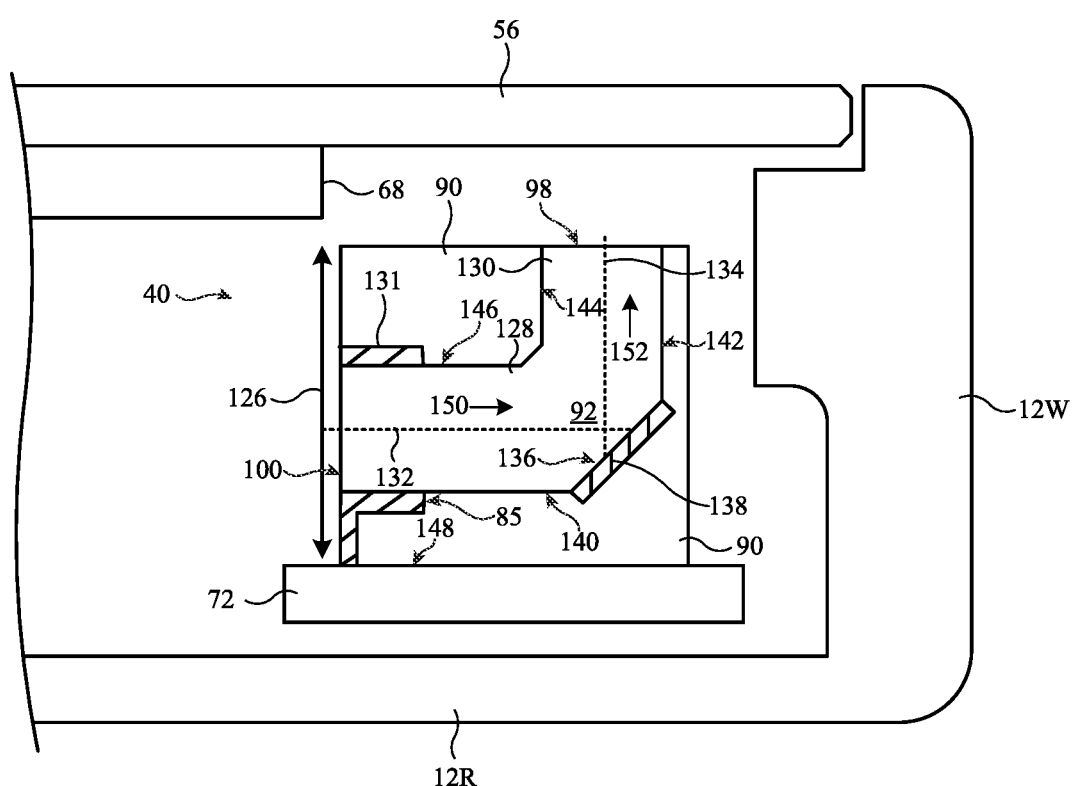
FIG. 8 is a cross-sectional side view of an illustrative bent dielectric resonator antenna that may be mounted within an electronic device in accordance with some embodiments.

FIG. 8 is a cross-sectional side view of device 10 showing one example of a bent dielectric resonating element that may be disposed in device 10 (e.g., for radiating through a dielectric cover layer such as display cover layer 56). As shown in FIG. 8, antenna 40 may be mounted to circuit board 72 and aligned with an opening between display module 68 and peripheral conductive housing structures 12W. Rather than being formed from a single linear column of dielectric material (e.g., as shown in the examples of FIGS. 6 and 7), dielectric resonating element 92 may be a bent dielectric resonating element.

When configured as a bent dielectric resonating element, dielectric resonating element 92 may have at least two segments that extend along different longitudinal axes (e.g., longitudinal axes that are non-parallel with respect to each other). For example, as shown in FIG. 8, dielectric resonating element 92 may include a first segment (portion) 128 that extends from bottom surface 100 of the dielectric resonating element and along a corresponding longitudinal axis 132. Dielectric resonating element 92 may also have a second segment (portion) 130 that extends, from the end of first segment 128 opposite bottom surface 100, and along longitudinal axis 134 to top surface 98 of dielectric resonating element 92. Longitudinal axis 134 may be oriented at a non-parallel angle with respect to longitudinal axis 132. For example, longitudinal axis 134 may be oriented perpendicular to longitudinal axis 132 (e.g., longitudinal axis 132 may extend parallel to the Y axis whereas longitudinal axis 134 extends parallel to the Z axis of FIG. 8). This may configure dielectric resonating element 92 to have a perpendicular bend between bottom surface 100 and top surface 98. The bent dielectric resonating element of FIG. 8 may be manufactured using current sintering and a wire saw, as one example. First segment 128 and second segment 130 may be embedded (molded) within dielectric substrate 90 and mounted to circuit board 72.

First segment 128 of dielectric resonating element 92 may have at least a first sidewall 140 and a second sidewall 146 opposite first sidewall 140 (e.g., on opposing sides of longitudinal axis 132). Feed probe 85 may be coupled to first sidewall 140 and may, if desired, be molded within dielectric substrate 90. Feed probe 85 may be soldered to a signal trace on circuit board 72 (e.g., using a Surface Mount Technology (SMT) process when mounting antenna 40 to circuit board 72). Antenna 40 may also have a conductive structure 131 disposed on second sidewall 146 opposite feed probe 85. Conductive structure 131 may include a feed probe for antenna 40 (e.g., a feed probe 85 for covering additional polarizations as shown in FIG. 7), may include a parasitic element (e.g., a parasitic patch) pressed against dielectric resonating element 92 and coupled to ground, or may be omitted. When conductive structure 131 is a feed probe, conductive structure 131 may be coupled to a signal trace on circuit board 72 (e.g., conductive traces 82 of FIG. 6). When conductive structure 131 is a parasitic element, conductive structure 131 may be soldered to a ground trace on circuit board 72. Conductive structure 131 need not be disposed on the sidewall opposite feed probe 85 and may, if desired, be disposed on one or more sidewalls extending between sidewalls 146 and 140 (not shown in the cross-sectional side view of FIG. 8).

First segment 128 may have a length extending parallel to longitudinal axis 132 from bottom surface 100 to second segment 130. First segment 128 may also have a width measured from sidewall 146 to sidewall 140 that is less than the length of first segment 128. The length of first segment 128 may be less than the length of the dielectric resonating element in scenarios where the dielectric resonating element is a straight, unbent column (e.g., height 114 of FIG. 7). The width of first segment 128 may, for example, be less than the length of first segment 128.

Second segment 130 of dielectric resonating element 92 may have at least a first sidewall 142 and a second sidewall 144 opposite first sidewall 142 (e.g., on opposing sides of longitudinal axis 134). Second segment 130 may have a length extending parallel to longitudinal axis 134 from first segment 128 to top surface 98. Second segment 130 may also have a width measured from first sidewall 142 to second sidewall 144. The width of second segment 130 may, for example, be less than the length of second segment 130. The length of second segment 130 may be less than the length of the dielectric resonating element in arrangements where the dielectric resonating element is a straight, unbent column (e.g., height 114 of FIG. 7). The dielectric resonating element 92 of FIG. 8 having first segment 128 and second segment 130 may sometimes be referred to herein as a bent dielectric resonating element or an angled dielectric resonating element.

The length of first segment 128 and the length of the second segment 130 may be selected to configure dielectric resonating element 92 to exhibit an overall length (e.g., as given by the sum of the first length and the second length) that is approximately equal to the length of the dielectric resonating element in scenarios where the dielectric resonating element is a straight, unbent column (e.g., the length of the first segment plus the length of the second segment may be approximately equal to height 114 of FIG. 7). This may configure dielectric resonating element 92 to exhibit a similar mix of electromagnetic resonant modes as in arrangements where dielectric resonating element 92 is a straight, unbent column (e.g., as shown in FIGS. 6 and 7), which configures dielectric resonating element 92 to convey radio-frequency signals at the desired frequencies greater than 10 GHz with satisfactory antenna efficiency when excited by feed probe 85.

At the same time, bending dielectric resonating element 92 in this way may configure antenna 40 to exhibit an overall height 126, as defined by the sum of the width of first segment 128, the length of second segment 130, and the portion of dielectric substrate 90 between first segment 128 and bottom end 148 of dielectric substrate 90. Overall height 126 may be less than the length of the dielectric resonating element in arrangements where the dielectric resonating element is a straight, unbent column (e.g., overall height 126 may be less than height 114 of FIG. 6). This may allow antenna 40 to fit within device 10 while minimizing the overall thickness of device 10.

While bending (angling) dielectric resonating element 92 in this way may allow for a reduction in the thickness of device 10, if care is not taken, the bent dielectric resonating element may exhibit deteriorated radio-frequency performance relative to arrangements in which the dielectric resonating element is a straight, unbent column. For example, if sidewalls 140 and 142 meet at a right angle, the right angle may cause unpredictable reflections of the radio-frequency signals excited in first segment 130, preventing a substantial amount of the electromagnetic energy from radiating through top surface 98 of dielectric resonating element 92 and limiting the overall performance of the antenna.

To optimize the radio-frequency performance of antenna 40, dielectric resonating element 92 may be provided with a surface 136 that couples sidewall 140 of first segment 128 to sidewall 142 of second segment 130. Surface 136 may be referred to herein as an angled surface 136 because surface 136 extends from sidewall 140 to sidewall 142 at an angle that is nonparallel with respect to the lateral plane of both sidewall 140 and sidewall 142 (e.g., at an angle that is nonparallel and thus non-zero with respect to both longitudinal axes 132 and 134). Angled surface 136 may sometimes be referred to herein as angled face 136, angled sidewall 136, or angled wall 136 of dielectric resonating element 92. If desired, the angle of angled surface 136 (e.g., as measured with respect to the Y-axis of FIG. 8) may be selected to reflect electromagnetic energy propagating along dielectric resonating element 92 within a total internal reflection (TIR) range of the first segment 128 and second segment 130. As examples, angled surface 136 may be oriented at a 45-degree angle, a 30-degree angle, a 60-degree angle, an angle between 30-60 degrees, an angle between 10-70 degrees, or other angles with respect to the Y-axis. Angled surface 136 may be planar or may be non-planar (e.g., curved).

For example, during signal transmission, feed probe 85 may excite first segment 128 of dielectric resonating element 92 to produce electromagnetic waves that propagate in direction 150. The electromagnetic waves may reflect off angled surface 136 and into second segment 130, which propagates the electromagnetic waves upwards (as shown by direction 152) and through top surface 98. This process may be reversed during signal reception. Angled surface 136 may help to ensure that a maximum amount of the electromagnetic energy (radio-frequency signals) propagating through first segment 128 is transferred to second segment 130 and vice versa.

To further optimize the radio-frequency signal reflection performed by angled surface 136 and thus the radio-frequency performance of antenna 40, a reflective structure such as reflector 138 may be provided at or on angled surface 136. Reflector 138 is a different material from the material of dielectric substrate 90 and dielectric resonating element 92. Reflector 138 may increase or augment the impedance discontinuity between dielectric material 92 and dielectric substrate 90 to maximize the reflective characteristics of angled surface 136 at radio frequencies. As one example, reflector 138 may include an air gap between dielectric substrate 90 and angled surface 136. As another example, reflector 138 may include a dielectric material (e.g., a dielectric coating) disposed on angled surface 136 and embedded within dielectric substrate 90. The dielectric material may have a dielectric constant that is farther from the dielectric constant of dielectric resonating element 92 than dielectric substrate 90. As yet another example, reflector 138 may include a conductive material that is disposed on angled surface 136 and embedded within dielectric substrate 90. The conductive material may include a conductive patch, stamped sheet metal, a metal plate, or metal foil that is affixed, pressed against, adhered to, or otherwise coupled to angled surface 136 (e.g., by dielectric substrate 90), or may include a conductive (e.g., metal) film, a conductive trace, or a conductive (e.g., metal) coating that is deposited (e.g., plated) onto angled surface 136 (e.g., using an LDS process, a sputtering process, a physical vapor deposition process, etc.) prior to molding dielectric substrate 90 over the dielectric resonating element. Reflector 138 may sometimes be referred to herein as reflector structure 138 or reflective structure 138. Metal materials may be particularly suitable for reflector 138 because metal exhibits a high reflectance at frequencies greater than 10 GHz. Such a reflector may be disposed using additional masking, plating, and/or coating operations during the manufacturing process of antenna 40 (e.g., after fabricating dielectric resonating element 92 using sintering and a wire saw).

In this way, antenna 40 may be configured to exhibit similar radio-frequency performance (e.g., antenna efficiency) in conveying radio-frequency signals through display cover layer 56 as in arrangements where the dielectric resonating element is a straight, unbent column, while also decoupling the thickness of device 10 from the length of dielectric resonating element 92 required to cover desired frequencies of interest. In other words, providing antenna 40 with a bent dielectric resonating element in this way may reduce the overall thickness of device 10 without deteriorating the radio-frequency performance of antenna 40 (e.g., at frequencies greater than 10 GHz) relative to arrangements in which the dielectric resonating element is a straight, unbent column.

The example of FIG. 8 is merely illustrative. If desired, dielectric resonating element 92 may include more than two segments that follow other longitudinal axes and that are coupled together using angled surfaces such as angled surface 136 and reflectors such as reflector 138. This may allow the dielectric resonating element to follow a meandering path from bottom surface 100 to top surface 98 to fit into other device form factors. Reflector 138 may overlap or cover all of angled surface 136 or only a portion of angled surface 136. Bottom end 148 of dielectric substrate 90 may be mounted to circuit board 72 or, if desired, circuit board 72 may be mounted (e.g., soldered) to bottom surface 100 of dielectric resonating element 92 (e.g., some or all of circuit board 72 may be oriented vertically such that the lateral surface of some or all of the circuit board extends within the X-Z plane of FIG. 8).

Dielectric resonating element 92 may have any desired cross-sectional shape (e.g., as viewed in direction 150, direction 152, or a direction parallel to the plane of angled surface 136). As one example, dielectric resonating element 92 may have a rectangular (e.g., square) cross section. A rectangular cross section may maximize ceramic utilization, for example. As another example, dielectric resonating element 92 may have a hexagonal cross-sectional shape (profile).

Figure 9:
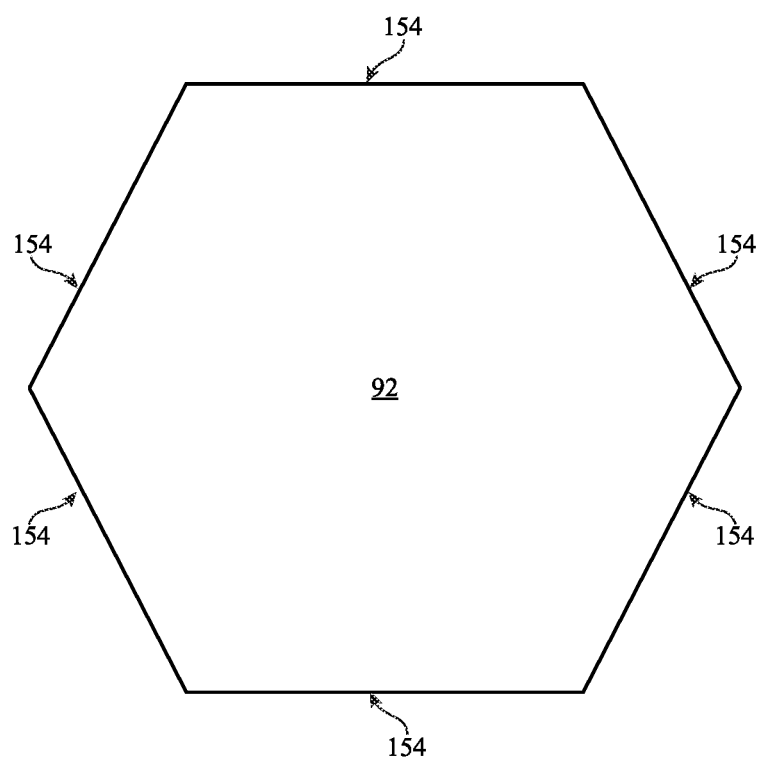
FIG. 9 is a cross-sectional view of an illustrative bent dielectric resonator element for covering multiple polarizations in accordance with some embodiments.

FIG. 9 is a cross-sectional view (e.g., as viewed in direction 150, direction 152, or a direction parallel to the plane of angled surface 136) showing how dielectric resonating element 92 may have a hexagonal cross section or profile. As shown in FIG. 9, dielectric resonating element 92 may have a hexagonal cross section with six sidewalls 154 (e.g., sidewalls of equal length). The longitudinal axis of dielectric resonating element 92 may extend through the center of the dielectric resonating element into and out of the plane of the page.

Within first segment 128 (FIG. 8), one or more feed probes 85 may be disposed on one or more sidewalls 154 of dielectric resonating element 92 (e.g., adjacent sidewalls 154). If desired, parasitic elements (e.g., conductive structure 131 of FIG. 8) may be disposed on the sidewall(s) 154 opposite to the sidewall(s) 154 where the feed probes are disposed. Where first segment 128 meets second segment 130 (FIG. 8), sidewalls 154 may form angled surfaces such as angled surface 136 of FIG. 8 (e.g., six angled surfaces that extend parallel to each other and angled surface 136 of FIG. 8). One or more sidewalls 154 (e.g., a pair of adjacent sidewalls 154, a pair of opposing sidewalls 154, all six sidewalls 154, etc.) may be provided with respective reflectors 138 for reflecting radio-frequency signals between the first and second segments of the dielectric resonating element. This may allow the reflectors to fully reflect and couple radio-frequency signals of different polarizations between the first segment and the second segment, for example. The hexagonal profile of FIG. 9 may be particularly suitable for reflecting horizontally and vertically polarized radio-frequency signals excited on the first segment by a pair of feed probes 85 (e.g., because dielectric resonating elements having a rectangular cross section may produce undesirable mixing between orthogonal polarizations in reflecting radio-frequency signals between the first and second segments, whereas reflecting off of angled surfaces that follow a hexagonal cross-sectional profile minimize such mixing). The example of FIG. 9 is merely illustrative and, in general, dielectric resonating element 92 may have any desired cross-sectional shape or profile (e.g., having any desired number of straight and/or curved sides of any desired length).

Device 10 may gather and/or use personally identifiable information. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The foregoing is merely illustrative and various modifications can be made by those skilled in the art without departing from the scope and spirit of the described embodiments. The foregoing embodiments may be implemented individually or in any combination.

What is claimed is:

1. An electronic device comprising:
   a housing having peripheral conductive housing structures;
   a dielectric cover layer on the housing;
   a circuit board;
   a dielectric substrate on the circuit board;
   a bent dielectric resonating element embedded in the dielectric substrate and configured to convey radio-frequency signals through the dielectric cover layer; and
   a display having a display panel, wherein the dielectric cover layer covers the display panel, the bent dielectric resonating element being configured to convey the radio-frequency signals through a gap between the display panel and the peripheral conductive housing structures.

2. The electronic device of claim 1, wherein the bent dielectric resonating element has a first segment extending along a first longitudinal axis and a second segment extending, from the first segment, along a second longitudinal axis that is nonparallel to the first longitudinal axis.

3. The electronic device of claim 2, wherein the second longitudinal axis is perpendicular to the first longitudinal axis.

4. The electronic device of claim 3, wherein the bent dielectric resonating element has a surface that extends nonparallel to the first and second longitudinal axes and that couples the first segment to the second segment.

5. The electronic device of claim 4, further comprising:
   a reflector on the surface.

6. The electronic device of claim 5, wherein the reflector comprises an air gap.

7. The electronic device of claim 5, wherein the reflector comprises metal.

8. The electronic device of claim 3, further comprising:
a feed probe coupled to the first segment, soldered to the circuit board, and embedded within the dielectric substrate.

9. The electronic device of claim 8, further comprising:
an additional feed probe coupled to the first segment, wherein the feed probe is configured to convey radio-frequency signals of a first polarization and the additional feed probe is configured to convey radio-frequency signals of a second polarization.

10. The electronic device of claim 9, wherein the bent dielectric resonating element has a hexagonal cross-sectional profile.

11. An electronic device comprising:
a dielectric layer;
a dielectric resonating element having
  a first segment with a first sidewall extending along a first longitudinal axis,
  a second segment with a second sidewall extending along a second longitudinal axis that is oriented nonparallel to the first longitudinal axis, and
  a surface that couples the first sidewall to the second sidewall, the surface being oriented nonparallel to the first longitudinal axis and nonparallel to the second longitudinal axis; and
a feed probe coupled to the first segment and configured to excite the dielectric resonating element to radiate through the dielectric layer.

12. The electronic device of claim 11, further comprising:
a dielectric substrate molded over the first and second segments.

13. The electronic device of claim 11, wherein the feed probe is coupled to the first sidewall, the electronic device further comprising:
a printed circuit, wherein the feed probe is soldered to the printed circuit.

14. The electronic device of claim 11, further comprising:
a reflector on the surface.

15. The electronic device of claim 14, wherein the reflector comprises metal.

16. The electronic device of claim 15, further comprising:
a dielectric substrate molded over the first segment, the second segment, and the reflector.

17. The electronic device of claim 11, wherein the dielectric layer comprises a display cover layer, the first longitudinal axis extends parallel to a lateral surface of the display cover layer, and the second longitudinal axis extends perpendicular to the first longitudinal axis.

18. An antenna comprising:
a dielectric resonating element having
  a first segment extending along a first longitudinal axis,
  a second segment extending along a second longitudinal axis,
  a first angled surface that couples the first segment to the second segment and that extends nonparallel to the first and second longitudinal axes, and
  a second angled surface that couples the first segment to the second segment and that extends parallel to the first angled surface;
a first reflector on the first angled surface;
a second reflector on the second angled surface; and
first and second feed probes coupled to the first segment and configured to excite the dielectric resonating element to convey radio-frequency signals of first and second polarizations at a frequency greater than 10 GHz.

19. The antenna of claim 18, wherein the first segment and the second segment have a hexagonal cross-sectional profile.

* * * * *